United States Patent [19]

Blanchet-Fincher

[11] Patent Number: 5,766,819

[45] Date of Patent: Jun. 16, 1998

[54] DONOR ELEMENTS, ASSEMBLAGES, AND ASSOCIATED PROCESSES WITH FLEXIBLE EJECTION LAYER(S) FOR LASER-INDUCED THERMAL TRANSFER

[75] Inventor: Graciela Beatriz Blanchet-Fincher, Greenville, Del.

[73] Assignee: E. I. duPont de Nemours and Company, Wilmington, Del.

[21] Appl. No.: 757,717

[22] Filed: Nov. 26, 1996

[51] Int. Cl.$^6$ .............................. G03C 5/54; G03C 1/94
[52] U.S. Cl. .................. 430/201; 430/200; 430/253; 430/275.1; 430/276.1; 430/278.1; 430/945; 430/964
[58] Field of Search .................... 430/200, 201, 430/275.1, 276.1, 945, 964, 278.1, 253

[56] References Cited

U.S. PATENT DOCUMENTS

| | | | |
|---|---|---|---|
| 4,105,569 | 8/1978 | Crossfield | 252/8.6 |
| 4,347,300 | 8/1982 | Shimazu et al. | 430/156 |
| 4,476,267 | 10/1984 | Barda et al. | 524/265 |
| 4,588,674 | 5/1986 | Stewart et al. | 430/273 |
| 4,963,606 | 10/1990 | Schleifstein | 524/180 |
| 4,985,503 | 1/1991 | Bronstert et al. | 525/193 |
| 4,990,580 | 2/1991 | Ishihara et al. | 526/160 |
| 5,156,938 | 10/1992 | Foley et al. | 430/200 |
| 5,162,445 | 11/1992 | Powers et al. | 525/333.4 |
| 5,171,650 | 12/1992 | Ellis et al. | 430/20 |
| 5,212,232 | 5/1993 | Kuramoto et al. | 524/779 |
| 5,238,990 | 8/1993 | Yu et al. | 524/504 |
| 5,256,506 | 10/1993 | Ellis et al. | 430/20 |
| 5,262,275 | 11/1993 | Fan | 430/273 |
| 5,308,737 | 5/1994 | Bills et al. | 430/201 |
| 5,378,385 | 1/1995 | Thomas et al. | 252/68 |
| 5,506,086 | 4/1996 | Van Zoeren | 430/201 |
| 5,523,192 | 6/1996 | Blanchet-Fincher | 430/200 |
| 5,563,019 | 10/1996 | Blanchet-Fincher | 430/200 |
| 5,607,814 | 3/1997 | Fan et al. | 430/258 |
| 5,633,113 | 5/1997 | Ellis | 430/201 |

FOREIGN PATENT DOCUMENTS

| | | |
|---|---|---|
| 0 113 167 A3 | 7/1984 | European Pat. Off. . |
| 649757 | 4/1995 | European Pat. Off. . |
| 0 689 939 A1 | 1/1996 | European Pat. Off. . |
| 0 689 940 A1 | 1/1996 | European Pat. Off. . |
| WO 90/12342 | 10/1990 | WIPO . |

*Primary Examiner*—Christopher G. Young

[57] ABSTRACT

Donor elements, assemblages, and associated processes are described for use in a laser-induced thermal transfer process, said elements comprising in the order listed (a) at least one flexible ejection layer comprising a first polymer having a decomposition temperature $T_1$ and characteristic glass transition temperatures of $T_g^0$ and $T_g^1$ for unplasticized and plasticized polymer samples, respectively, wherein the tensile modulus of the flexible ejection layer(s) structure is less than or equal to 2.5 Gigapascals; (b) at least one heating layer; (c) at least one transfer layer comprising (i) a second polymer having a decomposition temperature $T_2$, wherein $T_2 \geq (T_1 + 100° C.)$ and (ii) an imageable component, with the proviso in some embodiments that an inflexible support substrate is absent in the donor element at least during the thermal transfer process or in other embodiments that a support is absent in the donor element at least during the thermal transfer process. These donor elements are useful in proofing and lithographic printing applications. Assemblages made with these donor elements are useful for fabrication of photomasks on various photohardenable materials, including flexographic printing plates and photoresists. These photomasks are useful in creating a relief image with a photosensitive element, such as flexographic printing plate or a photoresist.

39 Claims, 5 Drawing Sheets

DONOR ELEMENTS, ASSEMBLAGES, AND ASSOCIATED PROCESSES WITH FLEXIBLE EJECTION LAYER(S) FOR LASER-INDUCED THERMAL TRANSFER

FIELD OF THE INVENTION

This invention relates to a donor element for laser-induced thermal transfer processes. More particularly, it relates to a multilayer donor element.

BACKGROUND OF THE INVENTION

Laser-induced thermal transfer processes are well-known in applications such as color proofing and lithography. Such laser-induced processes include, for example, dye sublimation, dye transfer, melt transfer, and ablative material transfer. These processes have been described in, for example, Baldock, U.K. Patent 2,083,726; DeBoer, U.S. Pat. No. 4,942,141; Kellogg, U.S. Pat. No. 5,019,549; Evans, U.S. Pat. No. 4,948,776; Foley et al., U.S. Pat. No. 5,156,938; Ellis et al., U.S. Pat. No. 5,171,650; and Koshizuka et al., U.S. Pat. No. 4,643,917.

Laser-induced processes use a laserable assemblage comprising (a) a donor element that contains the imageable component, i.e., the material to be transferred, and (b) a receiver element. The donor element is imagewise exposed by a laser, usually an infrared laser, resulting in transfer of material to the receiver element. The exposure takes place only in a small, selected region of the donor at one time, so that the transfer can be built up one pixel at a time. Computer control produces transfer with high resolution and at high speed.

For the preparation of images for proofing applications and in photomask fabrication, the imageable component is a colorant. For the preparation of lithographic printing plates, the imageable component is an olephilic material which will receive and transfer ink in printing.

Laser-induced processes are fast and result in transfer of material with high resolution. However, in many cases, the resulting transferred material does not have the required durability of the transferred image. In dye sublimation processes, light-fastness is frequently lacking. In ablative and melt transfer processes, poor adhesion and/or durability can be a problem. In patent applications having Ser. No. 08/268,461, filed on Jun. 30, 1994 (now issued U.S. Pat. No. 5,563,019), and Ser. No. 08/510,218, filed on Aug. 2, 1995 (now issued U.S. Pat. No. 5,523,192), improved multilayer thermal imaging elements and associated processes are disclosed that do afford improved adhesion and/or durability of the transferred images. However, there is a continuing need for still further improved thermal imaging elements and associated processes having improved image transfer efficiency and higher sensitivity of the elements.

Photosensitive elements which can be used to make relief images are well known. The photosensitive compositions generally comprise a photoinitiator and a component which is capable of reacting with the initiator, after it has been activated by exposure to actinic radiation. The reaction of the initiator and the second component produces a change in the physical properties of the layer such that the exposed areas can be differentiated from the nonexposed areas.

Imagewise exposure of a photosensitive element as currently known to the art generally requires the use of a phototool which is a mask (photomask) having clear and opaque areas covering the photosensitive layer (e.g., photoimageable and/or photopolymerizable layer). The phototool prevents exposure and photoreaction in the non-image areas, so that the image can be later developed. The phototool is clear, i.e., transparent to actinic radiation, in the image areas so that those areas are exposed to radiation. The phototool is usually a photographic negative (or positive) of the desired printing image. If corrections are needed in the final image a new negative (or positive) must be made. This is a time-consuming process. In addition, the phototool may change slightly in dimension due to changes in temperature and humidity. Thus, the same phototool, when used at different times or in different environments, may give different results and could cause registration problems.

Thus, it would be desirable to eliminate the practice of multiple use of a phototool and having to accurately align a phototool prior to imagewise exposure to avoid registration problems by digitally recording a phototool on a photosensitive element.

SUMMARY OF THE INVENTION

This invention encompasses donor element(s) and associated process(es) in which the donor element comprises at least one flexible ejection layer, which in turn comprises polymer(s) having characteristic glass transition temperatures (GTTs) which vary in magnitude with the amount of plasticization of the polymer(s) as defined in the following paragraph and/or polymer(s) or a layer or combined layers having a tensile modulus of less than or equal to 2.5 Gigapascals.

For a given polymer, $T_g^0$ is defined to be the characteristic glass transition temperature measured by differential scanning calorimetry (DSC) for that polymer, when the polymer sample used is either pure polymer containing no plasticizer or is at most only lightly plasticized polymer, such that the measured glass transition temperature is within + or −3° C. of that for the unplasticized polymer. All temperatures throughout the specification are in ° C. (degrees centigrade) unless noted otherwise. $T_g^0$ is thus the characteristic glass transition temperature for either the unplasticized polymer or the lightly plasticized polymer where the measured glass transition temperature is within + or −3° C. of that for the unplasticized, pure polymer. In contrast, for the same given polymer, $T_g^1$ is defined to be the characteristic glass transition temperature measured by differential scanning calorimetry (DSC) for that polymer, when the polymer sample used contains amounts of one or more plasticizers, such that the measured glass transition temperature is now $T_g^1$ instead of $T_g^0$, wherein $|T_g^0 - T_g^1| > 3°$ C. $T_g^1$ is thus the characteristic glass transition temperature for a plasticized sample of the polymer, in which the magnitude of $T_g^1$ will vary with the degree of plasticization.

This invention provides in one embodiment a donor element for use in a laser-induced thermal transfer process, said element comprising:

(a) at least one flexible ejection layer comprising a first polymer having a decomposition temperature $T_1$ and characteristic glass transition temperatures $T_g^1$ and $T_g^0$, wherein $T_g^0$ and $T_g^1$ are defined as above and also in the definitions section, and $|T_g^0 - T_g^1|$ is between 3° and 75° C. and wherein the flexible ejection layer has a tensile modulus of less than or equal to 2.5 Gigapascals;

(b) at least one heating layer; and (c) at least one transfer layer comprising (i) a second polymer having a decomposition temperature $T_2$ and (ii) an imageable component;

wherein $T_2 > (T_1 + 100°$ C.) with the proviso that the donor element does not include an inert inflexible support, at least during the operational stage —e.g., the laser imaging and ablation transfer steps.

This invention in another embodiment provides a donor element for use in a laser-induced thermal transfer process, said element comprising:
- (a) at least one flexible ejection layer comprising a first polymer having a decomposition temperature $T_1$, and characteristic glass transition temperatures $T_g^1$ and $T_g^0$, wherein $T_g^0$ and $T_g^1$ are defined as above and also in the definitions section, and $|T_g^0 - T_g^1|$ is between 3° and 75° C. and wherein the flexible ejection layer has a tensile modulus of less than or equal to 2.5 Gigapascals;
- (b) at least one heating layer; and
- (c) at least one transfer layer comprising (i) a second polymer having a decomposition temperature $T_2$ and (ii) an imageable component;

wherein $T_2 > (T_1 + 100°$ C.) with the proviso that the donor element does not include a support, at least during the operational stage —e.g., the laser imaging and ablation transfer steps.

The invention further relates to a donor element for use in a laser-induced thermal transfer process, said element comprising in the order listed:
- (a) a flexible bottom layer wherein said layer comprises a polymeric material and wherein the layer has a tensile modulus of <2.5 GPa;
- (b) at least one ejection layer comprising a first polymer having a decomposition temperature $T_1$;
- (c) at least one heating layer; and
- (d) at least one transfer layer comprising (i) a second polymer having a decomposition temperature $T_2$ and (ii) an imageable component;

and an optional thermal amplification additive is present in at least one of layers (b) and (d);
with the proviso that the donor element does not include an inflexible support having a tensile modulus of >2.9 GPa and wherein the polymer in layer (a) may be the same or different as the first polymer in layer (b).

In this invention, a flexible ejection layer or a flexible non-decomposable bottom layer with a decomposable ejection layer is defined to be one that is characterized in having a tensile modulus of less than or equal to 2.5 Gigapascals (GPa), when the tensile modulus is measured using an Instron® unit. Furthermore, in this invention, a nonflexible ejection layer or other layer is defined to be one (or a combination of ejection layer(s) and support)) that is characterized in having a tensile modulus of greater than 2.9 Gigapascals (GPa), when the tensile modulus is measured using an Instron® unit.

In donor elements comprising a thin ejection layer adjacent to a bottom layer, as discussed above, the bottom layer's tensile modulus governs the combined two-layer tensile modulus. For example, a 1 micron layer of ablatable binder over a Mylar® ( support has an estimated combined tensile modulus of >3.0 GPa (see Control in the examples section).

This invention also concerns a laser-induced thermal transfer process comprising:
(1) imagewise exposing to laser radiation a laserable assemblage comprising:
   (A) a donor element comprising in the order listed:
      (a) at least one flexible ejection layer comprising a first polymer having a decomposition temperature $T_1$, wherein the flexible ejection layer has a tensile modulus of less than or equal to 2.5 Gigapascals;
      (b) at least one heating layer; and
      (c) at least one transfer layer comprising (i) a second polymer having a decomposition temperature $T_2$ and (ii) an imageable component;
      wherein $T_2 > (T_1 + 100°$ C.) with the proviso that the donor element does not include an inert inflexible support; and
   (B) a receiver element in contact with the outer surface of the transfer layer (c) of the donor element; wherein a substantial portion of the transfer layer is transferred to the receiver element; and
(2) separating the donor element from the receiver element.

Steps (1)–(2) can be repeated at least once using the same receiver element and a different donor element having an imageable component the same as or different from the first imageable component. The term laserable in (1) above means capable of being activated by or responding to a laser.

DETAILED DESCRIPTION OF THE INVENTION

Figure 1:
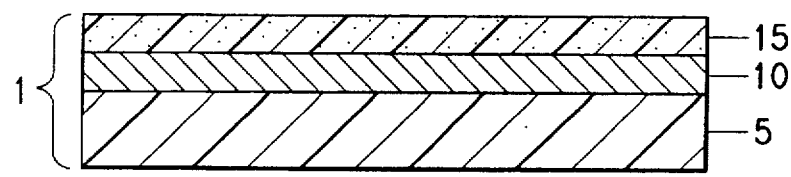
FIG. 1 illustrates a donor element (1) of the invention having an inherently flexible ejection layer (5).

This invention concerns a donor element for a laser-induced, thermal transfer process, and a process of use for such an element. The donor element comprises at least three layers. The layers have been chosen such that the specific functions required in the laser imaging process are addressed by different layers, which are formulated accordingly. That is, the required functions of heating, decomposition, and transfer are fully decoupled and independently formulated in one of the three specific layers, as is disclosed in patent applications Ser. No. 08/268,461, filed Jun. 30, 1994 (now issued U.S. Pat. No. 5,563,019), and Ser. No. 08/510,218 filed on Aug. 2, 1995 (now issued U.S. Pat. No. 5,523,192). In the present invention, there have been found additional advantageous benefits for a donor element comprising a flexible ejection layer together with a heating layer and transfer layer, but which lacks any separate inert non-flexible support layer. The donor element is combined with a receiver element 25 to form a laserable assemblage which is imagewise exposed by a laser to effect transfer of an imageable component from the donor element to the receiver element.

The present invention broadly relates to a donor element for use in a laser-induced thermal transfer process, comprising in the order listed:

(a) at least one flexible ejection layer comprising a first polymer having a decomposition temperature $T_1$ wherein the flexible ejection layer has a tensile modulus of less than or equal to 2.5 Gigapascals;

(b) at least one heating layer; and (c) at least one transfer layer comprising (i) a second polymer having a decomposition temperature $T_2$ and (ii) an imageable component;

wherein $T_2 > (T_1 + 100° C.)$;

wherein a thermal application additive may be present in at least one of layers (a) and (c) with the proviso that the donor element during the transfer process does not include an inflexible support substrate.

The term "flexible ejection layer" means that the layer has a tensile modulus of less than or equal to 2.5 Gigapascals (GPa) and also that the layer conforms readily to the receiver element to provide or assist in the provision of effective transfer of the transfer layer to the receiver element. Preferably, the tensile modulus is less than 1.5 Gigapascals (GPa). Furthermore, for ejection layers that are inherently inflexible when unplasticized, i.e., ejection layers having a tensile modulus of greater than or equal to 2.9 Gigapascals, the term "flexible ejection layer" further and alternatively means that the layer is plasticized with a sufficient amount of plasticizer(s), such that $T_g^0 - T_g^1$ is greater than 3° C. The flexible ejection layer may be inherently flexible —e.g., a low-decomposing binder of thickness in the 1–6 mil range may, because of its physical properties, have the requisite flexibility or additional components such as plasticizers may be added to achieve the desired flexibility. The "flexibility" of the ejection layer can be influenced by an adjacent flexible bottom layer which is either inherently flexible or has been made flexible by physical, mechanical, or chemical means. For example, a thin ablatable ejection layer comprising a first polymer having a decomposition temperature $T_1$, may be layered adjacent to an ablatable or non-ablatable flexible bottom layer which, in effect, lends its flexibility to the ejection layer. Furthermore, the thickness of the flexible bottom layer, if present, in addition to its physical and chemical properties is important in influencing the requisite flexibility of the ejection layer.

In addition to the property of flexibility, a second property of the flexible ejection layer according to this invention is its decomposition temperature—it must be suitably low (less than about 350° C., preferably less than about 325° C., and more preferably less than about 275° C.) and as defined above the decomposition temperature of the polymer (binder) of the flexible ejection layer must be at least 100° C. lower than for the transfer layer polymer (binder). These characteristics are an essential feature of the invention since it is the decomposition of portions of the ejection layer adjacent to the heating layer that produces low molecular weight components to provide the propulsive force to propel the transfer layer to the receiving element in an imagewise fashion for the exposed areas according to this invention.

The term "inflexible support" means a support substrate or other layer having a tensile modulus of >2.9 Gigapascals (GPa). This term also means those unplasticized or at most lightly plasticized support substrates generally described in the background art such as glass as well as certain polyesters, polycarbonates, polyurethanes, polyamides, polysulfones, polystyrenes, cellulosics, and/or opaque polyester, aluminum supports wherein their sole function is to serve as a support rather than, as in the present invention, serving to enhance and improve the transfer process and wherein the tensile modulus of the inflexible support is >2.9 GPa.

It was found that a donor element, such as the one described in the present invention having a flexible and low decomposition temperature ejection layer and further characterized by the absence of an inert, inflexible support, when used in a laser induced thermal transfer process, produces improved sensitivity and image transfer efficiency for the donor element and the laserable assemblage. While not wishing to be bound by any theories, it is believed that the flexible ejection layer of the donor element in this invention, which layer is comprised of a substantially plasticized polymer or other embodiments as disclosed herein, is such that the flexible ejection layer conforms better to the surface of the receiving layer than do corresponding non-flexible ejection layers not containing plasticizers and better than ablatable layers which are layered on top of inert and/or non-flexible support substrates. The support substrates of the prior art actually nullify any inherent flexibility of the known ablatable binder layer(s) and thus negatively affect the image transfer efficiency and density. This higher degree of conformability, possibly together with a higher level of mobility within the plasticized polymer matrix, may be responsible for the increased sensitivity and image transfer efficiency that are characteristic of the donor elements, laserable assemblages, and processes of this invention. In this invention, as in the earlier related inventions (e.g., U.S. patent application Ser. No. 8/268,461, filed Jun. 30, 1994 (now issued U.S. Pat. No. 5,563,109) and Ser. No. 08/510,218, filed Aug. 2, 1995 (now issued U.S. Pat. No. 5,523,192)), it is also crucial that the donor element have an ejection layer comprising a low decomposition temperature polymer, since decomposition of this polymer into gaseous low molecular weight components is what provides the propulsive force necessary to move the transfer layer in a imagewise fashion in exposed areas to the donor element.

The present invention, therefore, overcomes the deficiencies of previously known transfer assemblages and/or donor elements by providing a flexible, decomposable ejection layer which comprises a binder or binders having inherent low decomposition temperature(s) and inherent or induced flexibility which leads to effective transfer efficiency and density.

For a given ejection layer, support layer, or any other layer, or combined layers the tensile modulus is that value measured in Gigapascals (GPa) on an Instron® unit that is characteristic of the sample.

1. Donor Element

The donor element comprises in the order listed (a) at least one flexible ejection layer comprising a first polymer; (b) at least one heating layer; and (c) at least one transfer layer comprising (i) a second polymer and (ii) an imageable component, with the proviso that the donor element does not include an inert inflexible support during the operational steps or does not include a support during the operational steps.

The decomposition temperature of the first polymer is $T_1$, the decomposition temperature of the second polymer is $T_2$, and $T_2 > (T_1 + 100°\ C.)$. The characteristic glass transition temperatures of the first polymer are $T_g^0$ and $T_g$, wherein these temperatures are defined supra and in the definitions section. In embodiments where the ejection layer is inherently inflexible, $|T_g^0 - T_g^1|$ is $> 3°$ C. In embodiments where the ejection layer is inherently flexible, $|T_g^0 - T_g^1|$ is $> 0°$ C. A thermal amplification additive is an optional ingredient which may be present in at least one of layers (a) and (c).

2. Ejection Layer

The flexible ejection layer is, in the preferred embodiment, the first of the three functional layers. This layer provides the force to effect transfer of the imageable component to the receiver element. When heated, this layer decomposes into gaseous molecules providing the necessary pressure to propel or eject the imageable component onto the receiver element. This is accomplished by using a polymer having a relatively low decomposition temperature (less than about 350°20 C., preferably less than about 325° C., and more preferably less than about 275° C.). In the case of polymers having more than one decomposition temperature, the first decomposition temperature should be lower than 350° C. Furthermore, in order for the ejection layer to have suitably high flexibility and conformability, it should have a tensile modulus that is less than or equal to 2.5 Gigapascals (GPa) preferably less than 1.5 GPa and more preferably less than 1 Gigapascal (GPa). The polymer chosen should also be one that is dimensionally stable. If the laserable assemblage is imaged through the donor flexible ejection layer, the flexible ejection layer should be capable of transmitting the laser radiation, and not be adversely affected by this radiation.

Examples of suitable polymers include (a) polycarbonates having low decomposition temperatures $(T_d)$, such as polypropylene carbonate; (b) substituted styrene polymers having low decomposition temperatures, such as poly(alpha-methylstyrene); (c) polyacrylate and polymethacrylate esters, such as polymethylmethacrylate and polybutylmethacrylate; (d) cellulosic materials having low decomposition temperatures $(T_d)$, such as cellulose acetate butyrate and nitrocellulose; and (e) other polymers such as polyvinyl chloride; poly(chlorovinyl chloride) polyacetals; polyvinylidene chloride; polyurethanes with low $T_d$; polyesters; polyorthoesters; acrylonitrile and substituted acrylonitrile polymers; maleic acid resins; and copolymers of the above. Mixtures of polymers can also be used. Additional examples of polymers having low decomposition temperatures can be found in Foley et al., U.S. Pat. No. 5,156,938. These include polymers which undergo acid-catalyzed decomposition. For these polymers, it is frequently desirable to include one or more hydrogen donors with the polymer.

Preferred polymers for the ejection layer are polyacrylate and polymethacrylate esters, low $T_d$ polycarbonates, nitrocellulose, poly(vinyl chloride) (PVC), and chlorinated poly(vinyl chloride) (CPVC). Most preferred are poly(vinyl chloride) and chlorinated poly(vinyl chloride).

In general, it is preferred that the polymer for the ejection layer has a decomposition temperature less than 325° C., more preferably less than 275° C.

Other materials can be present as additives in the ejection layer as long as they do not interfere with the essential function of the layer. Examples of such additives include coating aids, flow additives, slip agents, antihalation agents, antistatic agents, surfactants, and others which are known to be used in the formulation of coatings.

One or more plasticizers can be added to a given ejection layer polymer composition in order to increase the flexibility of the polymeric composition. The increase in flexibility is indicated by changes in the magnitudes of two key physical parameters—the tensile modulus and the glass transition temperature (GTT). Both of these parameters tend to decrease in magnitude as the amount of plasticizer is increased, which indicates increasing flexibility of the polymeric composition. Example 24 illustrates this general trend.

A wide variety of different plasticizers can be used in order to increase the flexibility of an ejection layer composition. Suitable plasticizers, include, but are not limited to, the following: phthalic acid derivatives, such as diphenyl phthalate and di-(2-ethylhexyl) phthalate, ricinoleic acid derivatives, such as butyl ricinoleate and propylene glycol ricinoleate, sebacic acid derivatives, such as dibutyl sebacate and dimethyl sebacate, stearic acid derivatives, such as n-butyl stearate and propylene glycol monostearate, succinic acid derivatives, such as diethyl succinate, sulfonic acid derivatives, such as N-ethyl o,p-toluenesulfonamide, phosphoric acid derivatives, such as tricresyl phosphate and tributyl phosphate, paraffin derivatives, such as chloroparaffins containing about 40 to 70% chlorine, palmitic acid derivatives, such as isopropyl palmitate and methyl palmitate, oleic acid derivatives, such as butyl oleate and glycerol trioleate, myristic acid derivatives, such as isopropyl myristate, mellitates, such as tricapryl trimellitate and triisodecyl trimellitate, maleic acid derivatives, such as di-n-butyl maleate and di-(2-ethylhexyl) maleate, linoleic acid derivatives, such as methyl linoleate, lauric acid derivatives, such as methyl laurate, isophthalic acid derivatives, such as diphenyl isophthalate and dimethyl isophthalate, isobutyrate derivatives, such as 2,2,4-trimethyl-1,3-pentanediol, diisobutyrate, glycerol derivatives, such as glycerol triacetate, fumaric acid derivatives, such as dibutyl fumarate, epoxy derivatives, such as n-octyl epoxystearate, citric acid derivatives, such as tri-n-butyl citrate and acetyl triethyl citrate, benzoic acid derivatives, such as diethylene glycol dibenzoate and dipropylene glycol dibenzoate, azelaic acid derivatives, such as diisodecyl azelate and dimethyl azelate, and adipic acid derivatives, such as dicapryl adipate and diisodecyl adipate.

The binder polymer(s) generally makes up 100 percent by weight of the ejection layer unless plasticizer or other excipients are added. The relative weight percentage of plasticizer to binder varies depending upon the flexibility of the polymeric binder. The weight percentage of plasticizer generally ranges from 0–20 percent based upon the total weight of the ejection layer. The amount of plasticizer may be varied beyond this percentage range depending upon the particular polymeric composition and upon the desired tensile modulus and flexibility. Sufficient binder should be present at least in the proximity adjacent to the heating layer to effectively decompose and propel the transfer layer.

The donor flexible ejection layer in a three-layer system typically has a thickness of about 25 micrometers (1 mil) to about 200 micrometers (8 mils) when it is present as a single or multiple layer without an additional flexible bottom layer. The thickness of the flexible ejection layer(s) in this embodiment is important. If the thickness is less than about 25 micrometers (1 mil), the flexible ejection layer is not of sufficient strength to be properly handled readily; if the thickness is greater than about 200 micrometers (8 mils), the flexible ejection layer is likely to have reduced flexibility and conformability. A preferred thickness is about 25 micrometers (1 mil) to about 100 micrometers (4 mils). The most preferred thickness is about 50 micrometers (2 mils) to about 75 micrometers (3 mils).

Although it is preferred to have a single ejection layer, it is also possible to have more than one ejection layer or an ejection layer or layers on a flexible bottom layer—e.g.—at least a four-layer system. The different ejection layers in an ejection multilayer system can have the same or different compositions, as long as they all function as described above. The total thickness of all the ejection layers and/or the ejection layer(s) and the flexible bottom layer should be in the range given above, i.e., about 25 micrometers (1 mil) to about 200 micrometers (8 mils). Several different embodiments of ejection multilayer systems of this invention are described below. The invention is exemplified by these particular embodiments but is not limited to only these embodiments. If a flexible bottom layer is utilized the ejection layer can be less than 1 mil—e.g., an ultrathin layer to 1 mil.

In a first embodiment, the flexible ejection layer is a single homogeneous layer, comprising at least one polymer (binder) that is both inherently flexible (i.e., characterized in having a tensile modulus of less than or equal to 2.5 Gigapascals (GPa) and ablatable with a relatively low decomposition temperature (< about 350° C., preferably < about 325° C., and more preferably < about 275° C.) and as further defined within the specification. Preferably the tensile modulus is less than 1.5 Gigapascals and more preferably less than 1 Gigapascal. An example of a flexible ejection layer according to this invention having a single homogeneous layer without any added plasticizer(s) is a nitrated elastomer, such as nitrated poly(isoprene). This embodiment is illustrated in FIG. 1. As illustrated in FIG. 1, the donor element (1) of this embodiment comprises from bottom to top as shown in the figure an inherently flexible ejection layer (5), a heating layer (10), and a transfer layer (15). Since the ejection layer in this embodiment is inherently flexible, there is no need to add plasticizers for flexibility, but plasticizers can be added if desirable for even more flexibility or for other reasons.

Figure 2:
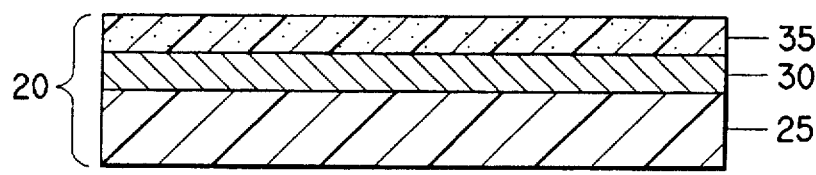
FIG. 2 illustrates a donor element (20) of the invention having a flexible ejection layer (25), wherein the ejection layer is made to be flexible by the addition of sufficient plasticizer to achieve the desired flexibility.

In a second embodiment, the flexible ejection layer is a single homogeneous layer, comprising at least one polymer (binder) that is either inherently flexible or non-flexible and further comprising at least one plasticizer that is present in sufficient amount to render the plasticized polymer binder to be sufficiently flexible as required for this invention [i.e. such that the flexible ejection layer has a tensile modulus of less than or equal to 2.5 Gigapascals (GPa), preferably less than 1.5 Gigapascals, and more preferably less than 1 Gigapascal]. Examples of flexible ejection layers according to this invention having a single homogeneous layer with added plasticizer(s) are poly(vinyl chloride) and chlorinated poly(vinyl chloride). This embodiment is illustrated in FIG. 2. As illustrated in FIG. 2, the donor element (20) of this embodiment comprises from bottom to top as shown in the figure a flexible ejection layer (25), a heating layer (30), and a transfer layer (35).

Figure 3:
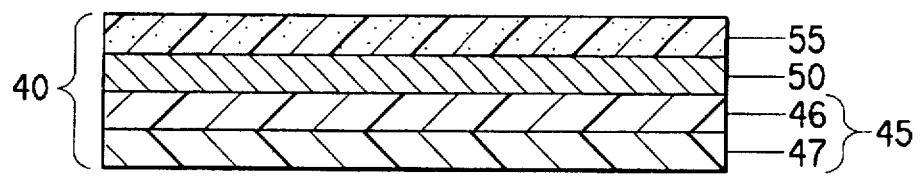
FIG. 3 illustrates a donor element (40) of the invention having a single flexible ejection layer (45), wherein the single ejection layer has an uneven distribution of plasticizer in the z-direction (perpendicular to the plane of the ejection layer).

In a third embodiment, the flexible ejection layer is a single layer that is homogeneous in the x,y directions (in the plane of the layer) but that is inhomogeneous in the z direction (perpendicular to the plane of the layer). In this embodiment plasticizer is distributed unevenly in the z direction, and either more or less plasticizer is present at locations nearer the ejection layer surface that contacts the heating layer in comparison to locations nearer the opposite ejection layer surface away from the heating layer. In this embodiment, it is preferred that there be more binder polymer and less plasticizer at locations nearer the ejection layer surface that contacts the heating layer in comparison to locations nearer the opposite ejection layer surface away from the heating layer. In this preferred case, there is more ablative binder polymer nearer the heating layer, which affords a higher ablative force. The flexible ejection layer in this embodiment has a tensile modulus of less than or equal to 2.5 Gigapascals, preferably less than 1.5 Gigapascals, and more preferably less than 1 Gigapascal. This embodiment is illustrated in FIG. 3. As illustrated in FIG. 3, the donor element (40) of this embodiment comprises from bottom to top as shown in the figure a single flexible ejection layer (45) having plasticizer distributed unevenly within this layer (45) in the z direction, a heating layer (50), and a transfer layer (55). The single, flexible ejection layer (45) comprises regions (46) of the single ejection layer containing relatively less plasticizer, and other regions (47) of the single ejection layer containing relatively more plasticizer. As indicated above and as illustrated in FIG. 3, the preferred third embodiment is one having regions (46) containing relatively less plasticizer and relatively more decomposable binder near to the heating layer, since this will provide a higher ablative force.

Figure 4:
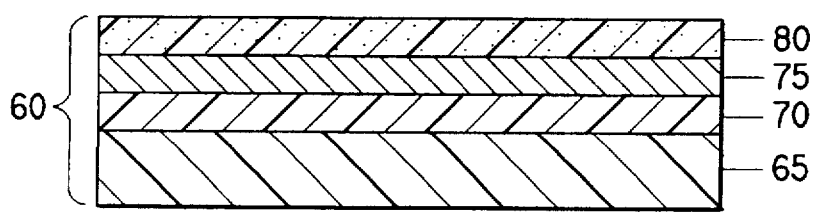
FIG. 4 illustrates a donor element (60) of the invention having an ejection layer adjacent to a bottom layer—the ejection layer is a thin or ultrathin binder layer (70) with or without plasticizer in contact with a flexible bottom layer (65) having the requisite tensile modulus. In this embodiment, the flexible bottom layer "lends" its flexibility to the thin ablatable ejection layer.

In a fourth embodiment, the ejection layer is a thin polymer (binder) layer either with or without plasticizer that is contacted with a flexible bottom layer on the face of the thin polymer (binder) layer opposite to that which contacts the heating layer. The flexible bottom layer is comprised of material that is either ablative or non-ablative depending upon the thickness of the thin binder layer, i.e., for ultrathin binder layers, both the binder layer and the flexible bottom layers of this embodiment should be ablatable to provide efficient transfer. By "thin", Applicants mean less than 25 micrometers (1 mil). Typical thin layers are 0.5 to 1 micrometer. The minimum thickness in this embodiment depends upon the particular ablative characteristics of the selected decomposable binder and upon the coating methods utilized to coat the ejection layer onto the flexible bottom layer. In any case, there should be sufficient decomposable binder present in either the ejection layer or ejection layer plus flexible bottom layer to effect the ablative transfer. By "ultrathin", Applicants mean that the ejection layer is such that it totally decomposes and additional decomposing binder from the flexible bottom layer is required to achieve transfer at the standard laser pulse. Furthermore, in this embodiment, the bottom layer must be flexible to create flexible ejection layer(s). The bottom layer may comprise the same or different ablatable binder (A) with respect to the thin polymer layer or it may be an inert non-ablative flexible bottom layer, such as polyethylene. It may be any material which has flexibility and lends it to the thin polymer layer [ablatable layer (B)]. The flexible bottom layer (and the flexible ejection layers) in this embodiment has a tensile modulus of less than or equal to 2.5 Gigapascals, preferably less than 1.5 Gigapascals, and more preferably less than 1 Gigapascal. This embodiment is illustrated in FIG. 4. As illustrated in FIG. 4, the donor element (60) of this embodiment comprises from bottom to top as shown in the figure a flexible bottom layer (65), a thin ejection layer (70), a heating layer (75), and a transfer layer (80).

Figure 5:
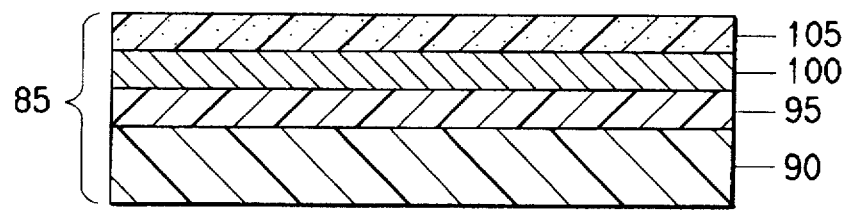
FIG. 5 illustrates a donor element (85) of the invention having an ejection layer adjacent to a bottom layer—the ejection layer is a thin high density ablatable binder layer (95) in contact with a flexible bottom layer (90).

In a fifth embodiment, the ejection layer comprises a thin high density ablatable binder layer on a flexible bottom layer in a layered structure wherein the high density binder layer is located between the heating layer and the flexible bottom layer. The ejection layer and flexible bottom layer in this embodiment has a tensile modulus of less than or equal to 2.5 Gigapascals, preferably less than 1.5 Gigapascals, and more preferably less than 1 Gigapascal. This embodiment is illustrated in FIG. 5. As illustrated in FIG. 5, the donor element (85) of this embodiment comprises from bottom to top as shown in the figure a flexible bottom layer (90), a thin high density ablatable ejection layer (95), a heating layer (100), and a transfer layer (105).

The ejection layer(s) can be coated onto a temporary support as a dispersion in a suitable solvent, provided that the resulting ejection layer(s) obtained upon drying are sufficiently transparent such that little or no scattering of laser light occurs. However, in most cases, it is preferred to coat the layer(s) from a solution to insure that a transparent ejection layer(s) results. Any suitable solvent can be used as a coating solvent, as long as it does not deleteriously affect the properties of the assemblage, using conventional coating techniques or printing techniques, such as those used in, for example, gravure printing. In all cases where a temporary support is used for coating the ejection layer, it is removed at some point in the manufacture of the donor element, such that the finished donor element of this invention comprises at least one ejection layer, at least one heating layer, and at least one transfer layer without there being present any inert inflexible support during the operational stage.

A thermal amplification additive is optionally present in the ejection layer(s) or the transfer layer. It can also be present in both of these layers.

The function of the additive is to amplify the effect of the heat generated in the heating layer and thus to further increase sensitivity. The additive should be stable at room temperature. The additive can be (1) a compound which, when heated, decomposes to form gaseous byproducts(s), (2) a dye which absorbs the incident laser radiation, or (3) a compound which undergoes a thermally induced unimolecular rearrangement which is exothermic. Combinations of these types of additives may also be used.

Thermal amplification additives which decompose upon heating include those which decompose to form nitrogen, such as diazo alkyls, diazonium salts, and azido (—$N_3$) compounds; ammonium salts; oxides which decompose to form oxygen; carbonates; peroxides. Mixtures of additives can also be used. Preferred thermal amplification additives of this type are diazo compounds such as 4-diazo-N,N' diethyl-aniline fluoroborate (DAFB).

When the absorbing dye is incorporated in the ejection layer, its function is to absorb the incident radiation and convert this into heat, leading to more efficient heating. It is preferred that the dye absorb in the infrared region. For imaging applications, it is also preferred that the dye have very low absorption in the visible region. Examples of suitable infrared absorbing dyes which can be used alone or in combination include poly(substituted) phthalocyanine compounds and metal-containing phthalocyanine compounds; cyanine dyes; squarylium dyes; chalcogenopyryio-acrylidene dyes; croconium dyes; metal thiolate dyes; bis (chalcogenopyrylo) polymethine dyes; oxyindolizine dyes; bis(aminoaryl) polymethine dyes; merocyanine dyes; and quinoid dyes.

Infrared absorbing materials disclosed in U.S. Pat. Nos. 4,778,128; 4,942,141; 4,948,778; 4,950,639; 5,019,549; 4,948,776; 4,948,777 and 4,952,552 may also be suitable herein. The weight percentage of the thermal amplification additive, versus, for example, the total solid weight composition of the ejection layer may range from 0–20%. When present in the transfer coating, the thermal amplification weight percentage is generally at a level of 0.95–11.5%. The percentage can range up to 25% of the total weight percentage in the transfer coating. These percentages are non-limiting and one of ordinary skill in the art can vary them depending upon the particular composition of the ejection layer or transfer layer.

3. Heating Layer

The heating layer is deposited on the flexible ejection layer. The function of the heating layer is to absorb the laser radiation and convert the radiation into heat. Materials suitable for the layer can be inorganic or organic and can inherently absorb the laser radiation or include additional laser-radiation absorbing compounds.

Examples of suitable inorganic materials are transition metal elements and metallic elements of Groups IIIa, IVa, Va, VIa, VIII, IIIb, and Vb, their alloys with each other, and their alloys with the elements of Groups Ia and Ia. Tungsten (W) is an example of a Group VIa metal that is suitable and which can be utilized. Carbon (a Group IVb nonmetallic element) can also be used. Preferred metals include Al, Cr, Sb, Ti, Bi, Zr, $TiO_2$, Ni, In, Zn, and their alloys; carbon is a preferred nonmetal. More preferred metals and nonmetals include Al, Ni, Cr, Zr and C. Most preferred metals are Al, Ni, Cr, and Zr.

The thickness of the heating layer is generally about 20 Angstroms to 0.1 micrometer, preferably about 50 to 100 Angstroms.

Although it is preferred to have a single heating layer, it is also possible to have more than one heating layer, and the different layers can have the same or different compositions, as long as they all function as described above. The total thickness of all the heating layers should be in the range given above, i.e., 20 Angstroms to 0.1 micrometer.

The heating layer(s) can be applied using any of the well-known techniques for providing thin metal layers, such as sputtering, chemical vapor deposition, and electron beam.

4. Transfer Layer

The transfer layer comprises (i) a polymeric binder which is different from the polymer in the ablatable portion(s) of the ejection layer, and (ii) an imageable component.

The polymer (binder) for the transfer layer is a polymeric material having a decomposition temperature of at least 100° C. greater than the decomposition temperature of the polymer (binder) in the ejection layer, preferably more than 150° C. greater. The binder should be film forming and coatable from solution or from a dispersion. Binders having melting points less than about 250° C. or plasticized to such an extent that the glass transition temperature is <70° C. are preferred. However, heat-fusible binders, such as waxes should be avoided as the sole binder since such binders may not be as durable, although they are useful as cobinders in decreasing the melting point of the transfer layer.

It is preferred that the binder (polymer) does not self-oxidize, decompose or degrade at the temperature achieved during the laser exposure so that the imageable component and binder are transferred intact for improved durability. Examples of suitable binders include copolymers of styrene and (meth)acrylate esters, such as styrene/methylmethacrylate; copolymers of styrene and olefin monomers, such as styrene/ethylene/butylene; copolymers of styrene and acrylonitrile; fluoropolymers; copolymers of (meth) acrylate esters with ethylene and carbon monoxide; polycarbonates having higher decomposition temperatures; (meth)acrylate homopolymers and copolymers; polysulfones; polyurethanes; polyesters. The monomers for the above polymers can be substituted or unsubstituted. Mixtures of polymers can also be used.

In general, it is preferred that the polymer (binder) for the transfer layer has a decomposition temperature greater than 400° C. More preferably, the polymer (binder) for the transfer layer has a decomposition temperature greater than 425° C. Preferred polymers for the transfer layer are ethylene copolymers, as they provide high decomposition temperatures with low melting temperatures and high specific heat. Most preferred is a copolymer of n-butyl acrylate, ethylene and carbon monoxide.

The binder (polymer) generally has a concentration of about 15-50% by weight, based on the total weight of the transfer layer, preferably 30-40% by weight.

The nature of the imageable component will depend on the intended application for the assemblage. For proofing applications, the imageable component preferably has a decomposition temperature that is greater than that of the polymeric material in the ejection layer. It is most preferred that the imageable component have a decomposition that is at least as great as the decomposition temperature of the binder polymer in the transfer layer.

For imaging applications, the imageable component will be a colorant. The colorant can be a pigment or a non-sublimable dye. It is preferred to use a pigment as the colorant for stability and for color density, and also for the high decomposition temperature. Examples of suitable inorganic pigments include carbon black and graphite. Examples of suitable organic pigments include Rubine F6B (C. I. No. Pigment 184); Cromophthal® Yellow 3G (C. I. No. Pigment Yellow 93); Hostaperm® Yellow 3G (C. I. No. Pigment Yellow 154); Monastral® Violet R (C. I. No. Pigment Violet 1); 2,9-dimethylquinacridone (C. I. No. Pigment Red 122); Indofast® Brilliant Scarlet R6300 (C. I. No. Pigment Red 123); Quindo Magenta RV 6803; Monastral® Blue G (C. I. No. Pigment Blue 15); Monastral® Blue BT 383D (C. I. No. Pigment Blue 15); Monastral® Blue G BT 284D (C. I. No. Pigment Blue 15); and Monastral® Green GT 751D (C. I. No. Pigment Green 7). Combinations of pigments and/or dyes can also be used.

In accordance with principles well known to those skilled in the art, the concentration of colorant will be chosen to achieve the optical density desired in the final image. The amount of colorant will depend on the thickness of the active coating and the absorption of the colorant. Optical densities greater than 1.3 at the wavelength of maximum absorption are typically required.

A dispersant is usually present when a pigment is to be transferred, in order to achieve maximum color strength, transparency and gloss. The dispersant is generally an organic polymeric compound and is used to separate the fine pigment particles and avoid flocculation and agglomeration. A wide range of dispersants is commercially available. A dispersant will be selected according to the characteristics of the pigment surface and other components in the composition as practiced by those skilled in the art. However, one class of dispersant suitable for practicing the invention is that of the AB dispersants. The A segment of the dispersant adsorbs onto the surface of the pigment. The B segment extends into the solvent into which the pigment is dispersed. The B segment provides a barrier between pigment particles to counteract the attractive forces of the particles, and thus to prevent agglomeration. The B segment should have good compatibility with the solvent used. The AB dispersants of choice are generally described in "Use of AB Block Polymers as Dispersants for Non-aqueous Coating Systems", by H. C. Jakubauskas, Journal of Coating Technology, Vol. 58, No. 736, pages 71-82. Suitable AB dispersants are also disclosed in U.K. Patent 1,339,930 and U.S. Pat. Nos. 3,684,771; 3,788,996; 4,070,388; 4,912,019; and 4,032,698. Conventional pigment dispersing techniques, such as ball milling, sand milling, etc., can be employed.

For lithographic applications, the imageable component is an oleophilic, ink-receptive material. The oleophilic material is usually a film-forming polymeric material and may be the same as the binder. Examples of suitable oleophilic materials include polymers and copolymers of acrylates and methacrylates; polyolefins; polyurethanes; polyesters; polyaramids; epoxy resins; novolak resins; and combinations thereof. Preferred oleophilic materials are acrylic polymers.

The imageable component can also be a resin capable of undergoing a hardening or curing reaction after transfer to the receiver element. The term "resin" as used herein encompasses (a) low molecular weight monomers or oligomers capable of undergoing polymerization reactions, (b) polymers or oligomers having pendant reactive groups which are capable of reacting with each other in crosslinking reactions, (c) polymers or oligomers having pendant reactive groups which are capable of reacting with a separate crosslinking agent, and (d) combinations thereof. The resin may or may not require the presence of a curing agent for the curing reaction to occur. Curing agents include catalysts, hardening agents, photoinitiators and thermal initiators. The curing reaction can be initiated by exposure to actinic radiation, heating, or a combination of the two.

In lithographic applications, a colorant can also be present in the transfer layer. The colorant facilitates inspection of the plate after it is made. Any of the colorants discussed above can be used. The colorant can be a heat-, light-, or acid-sensitive color former.

For photomask applications, a black dye and/or pigment such as carbon black or other dark material is present in the transfer layer as the imageable component. The imageable component(s) for photomask applications are chosen such that optical densities on the receiver element in areas where material has been transferred are preferably at least 2.0 and more preferably are about 3.0 or higher.

In general, for color proofing, photomask, and lithographic printing applications, the imageable component is present in an amount of from about 25 to 95% by weight, based on the total weight of the transfer coating. For color proofing applications, the amount of imageable component is preferably 35-65% by weight; for lithographic printing applications, preferably 65-85% by weight.

Although the above discussion was limited to color proofing, photomask, and lithographic printing applications, the element and process of the invention apply equally to the transfer of other types of imageable components in different applications. In general, the scope of the invention is intended to include any application in which solid material is to be applied to a receptor in a pattern. Examples of other suitable imageable components include, but are not limited to, magnetic materials, fluorescent materials, and electrically conducting materials.

Other materials can be present as additives in the transfer layer as long as they do not interfere with the essential function of the layer. Examples of such additives include coating aids, plasticizers, flow additives, slip agents, antihalation agents, antistatic agents, surfactants, and others which are known to be used in the formulation of coatings. However, it is preferred to minimize the amount of additional materials in this layer, as they may deleteriously affect the final product after transfer. Additives may add unwanted color for color proofing applications, or they may decrease durability and print life in lithographic printing applications.

The transfer layer generally has a thickness in the range of about 0.1 to 5 micrometers, preferably in the range of about 0.1 to 1.5 micrometers. Thicknesses greater than about 5 micrometers are generally not preferred as they require excessive energy in order to be effectively transferred to the receiver.

Although it is preferred to have a single transfer layer, it is also possible to have more than one transfer layer, and the different layers can have the same or different compositions, as long as they all function as described above. The total thickness of the combined transfer layers should be in the range given above.

The transfer layer(s) can be coated onto the heating layer of the donor or on a temporary support as a dispersion in a suitable solvent, however, it is preferred to coat the layer(s) from a solution. Any suitable solvent can be used as a coating solvent, as long as it does not deleteriously affect the properties of the assemblage, using conventional coating techniques or printing techniques, for example, gravure printing.

The donor element can have additional layers as well. For example, an antihalation layer can be used on the side of the flexible ejection layer opposite the transfer layer. Materials which can be used as antihalation agents are well known in the art. Other anchoring or subbing layers can be present on either side of the flexible ejection layer and are also well known in the art.

5. Receiver Element

The receiver element is the second part of the laserable assemblage, to which the imageable component and non-degraded polymer (polymeric binder) are transferred. In most cases, the imageable component will not be removed from the donor element in the absence of a receiver element. That is, exposure of the donor element alone to laser radiation does not cause material to be removed, or transferred into air. The material, i.e., the imageable component and binder, is removed from the donor element only when it is exposed to laser radiation and the donor element is in contact with the receiver element, i.e., the donor element actually touches the receiver element. This implies that, in such cases, complex transfer mechanisms are in operation.

The receiver element can be non-photosensitive or photosensitive. The non-photosensitive receiver element may comprise a receiver support and, optionally, an image-receiving layer. The receiver support comprises a dimensionally stable sheet material. The assemblage can be imaged through the receiver support if that support is transparent. Examples of transparent films include, for example polyethylene terephthalate, polyether sulfone, a polyimide, a poly(vinyl alcohol-co-acetal), or a cellulose ester, such as cellulose acetate. Examples of opaque support materials include, for example, polyethylene terephthalate filled with a white pigment such as titanium dioxide, ivory paper, or synthetic paper, such as Tyvek® spunbonded polyolefin. Paper supports are typical and are preferred for proofing applications, while a polyester support, such as poly(ethylene terephthalate) is typical and is preferred for a medical hardcopy application. For lithographic printing applications, the support is typically a thin sheet of aluminum, such as anodized aluminum, or polyester. Roughened supports may also be used in the receiver element.

Although the imageable component can be transferred directly to the receiver support, the receiver element typically has an additional image-receiving layer on one surface thereof For image formation applications, the image-receiving layer can be a coating of, for example, a polycarbonate, a polyurethane, a polyester, polyvinyl chloride, styrene/acrylonitrile copolymer, poly(caprolactone), and mixtures thereof This image-receiving layer can be present in any amount effective for the intended purpose. In general, good results have been obtained at coating weights of 1 to 5 g/m$^2$. For lithographic applications, typically an aluminum sheet is treated to form a layer of anodized aluminum on the surface as a receptor layer. Such treatments are well known in the lithographic art.

The receiver element does not have to be the final intended support for the imageable component. In other words, the receiver element can be an intermediate element and the laser imaging step can be followed by one or more transfer steps by which the imageable component is transferred to the final support. This is most likely the case for multicolor proofing applications in which the multicolor image is built up on the receiver element and then transferred to the permanent paper support.

Photosensitive Receiver Element

A photosensitive receiver element, which is particularly suited for use as a receiver element in the embodiments of this invention involving fabrication of a photomask on the photosensitive element and subsequent use of the photomask to generate a relief image, comprises:

(a) a support;

(b) a photohardenable layer, comprising a binder, at least one photohardenable component, and an initiator or initiator system having sensitivity to actinic radiation;

(c) an optional barrier layer; and (d) an optional coversheet.

The coversheet should provide the proper adhesion balance with the photohardenable layer and/or the optional barrier layer. Generally, the coversheet is a dimensionally stable polymeric film. The coversheet is generally a thin transparent film of polyester, polycarbonate, polyamide, fluoropolymers, polystyrene, polyethylene, polypropylene, or other strippable material. A preferred coversheet is polyethylene terephthalate. The coversheet typically has a thickness from 0.1 to 10 mils (0.00025 to 0.025 cm), with a preferred thickness of 0.5 to 5 mils (0.0013 to 0.013 cm). Typically, the coversheet is removed prior to forming the assemblage of photosensitive receiver element and donor element. If the coversheet remains as part of the assemblage, the coversheet must be transparent to actinic radiation so that the radiation passes through the coversheet to the photohardenable layer without significant diminution of intensity when exposed through the photomask formed by the donor element.

In a laserable assemblage, it is frequently desirable to have at least one barrier layer, (c) interposed between the photohardenable layer of the photosensitive receiver element and the transfer layer of the donor element. The photohardenable layers can be inherently tacky, especially the photohardenable layers used to make flexographic printing plates. The barrier layer can be helpful in achieving the correct adhesion balance. In addition, the barrier layer prevents the migration of monomer, if present, from the photohardenable layer to the transfer layer If the monomer is compatible with the materials used in the transfer layer and/or is migratory, monomer migration may occur with time and can drastically alter the adhesion balance. If the monomer is substantially incompatible with the transfer or top layer or substantially non-migratory, there may be no migration. But if there is even marginal compatibility, migration may occur. When the element is not imaged and developed immediately after it is put together, it is preferred that a barrier layer be present.

The barrier layer should be transparent to actinic radiation so that when the element is exposed to actinic radiation through the photomask created in or from the transfer layer or in the donor element, the radiation passes through the barrier layer to the underlying photohardenable layer without significant diminution in intensity.

The barrier layer should also initially (i.e., prior to exposure to actinic radiation) be soluble, swellable or dispersible in the developer solvent for the photopolymerizable layer or it should be liftable in that solvent. By "liftable" it is meant that the solvent is able to lift off the barrier layer at least partially intact.

Two types of barrier layers can be used. The first type is one which is insensitive to actinic radiation and is soluble, swellable, dispersible or liftable in developer solutions for the photopolymerizable layer both before and after exposure to actinic radiation. This type of barrier layer is completely removed in both exposed and unexposed areas, along with the unexposed areas of the photopolymerizable layer, during processing with the developer.

Examples of materials which are suitable for use as the barrier layer of this first type include those materials which are conventionally used as a release layer in flexographic printing elements, such as polyamides, polyvinyl alcohol, hydroxyalkyl cellulose, copolymers of ethylene and vinyl acetate, amphoteric interpolymers, and combinations thereof Polyamide is preferred.

The second type of barrier layer is one which is soluble, swellable or dispersible in the developer solvent prior to exposure to actinic radiation, but is not affected by the developer solvent after exposure to actinic radiation. When this type of barrier layer is used it is removed by the developer solvent only in those areas which are not exposed to actinic radiation. The barrier layer which has been exposed to actinic radiation remains on the surface of the polymerized areas of the photopolymerizable layer and becomes the actual printing surface of the printing plate.

This type of barrier layer can be photosensitive itself, i.e., contain monomer and initiator, or it can become photosensitive when in contact with the photo-polymerizable layer. This second type of barrier layer is usually a layer of an elastomeric composition. The composition can consist simply of a nonphoto-sensitive elastomeric binder layer similar to the binder in the photopolymerizable layer or it can be the binder in combination with a monomer and initiator. A preferred barrier layer is an elastomeric composition comprising an elastomeric polymeric binder, a second polymeric binder and optionally a nonmigatory dye or pigment. The elastomeric polymeric binder in the elastomeric composition is generally the same as or similar to the elastomeric binder present in the photopolymer layer. Suitable compositions for the barrier layer are those disclosed as elastomeric compositions in the multilayer cover element described in Gruetzmacher et al., U.S. Pat. Nos. 4,427,759 and 4,460,675.

It is also possible to use more than one barrier layer. For example, an elastomeric barrier layer can be present next to the photohardenable layer and this, in turn, can be overcoated with a barrier layer which is soluble both before and after exposure to actinic radiation. The exact choice of barrier layer(s) will depend on the nature of the photohardenable layer(s) of the photosensitive element and the transfer layer and other physical requirements of the laserable assemblage.

The support can be any material which is conventionally used with photosensitive elements and, in particular, those used to prepare flexographic printing plates or photoresists. Examples of suitable support materials include polymeric films such those formed by addition polymers and linear condensation polymers, translucent foams and fabrics. A preferred support is polyester film; particularly preferred is polyethylene terephthalate. The support typically has a thickness from 2 to 10 mils (0.0051 to 0.025 cm), with a preferred thickness of 3 to 8 mils (0.0076 to 0.020 cm). In addition, the support can be subbed or surface treated to improve adhesion.

The photohardenable layer generally comprises a photoinitiator or photoinitiator system, which is sensitive to actinic radiation, and a component that is capable of reacting with the initiator, after it has been activated by exposure to actinic radiation. The interaction of the initiator and the component produces a change in the physical properties of the layer. The areas of the photohardenable layer which have been exposed to actinic radiation are differentiated from the areas which have not been exposed based on the photoinduced difference in the physical properties of the exposed and nonexposed areas. The types of physical property changes in photohardenable layers that can be used to advantage in the process of the invention include changes in solubility, swellability or dispersability, changes in softening point, changes in tackiness, changes in permeability for processing solution, and the like.

Of interest, particularly for the formation of relief images, are those systems in which exposure to actinic radiation effects a change in solubility in the photohardenable layer. As used herein, the term "solubility" is intended to mean the ability to be removed by the action of a developer liquid and is intended to encompass swellability and dispersability, as well as complete solubility. The change in solubility can be an increase due to a photosolubilization reaction, or a decrease due to a photohardening reaction, either photocrosslinking or photopolymerization. Photosolubilization generally occurs by the reaction of a preformed polymer with either pendant reactive groups or other molecules to increase the solubility (or the rate of solubilization) of the photosensitive material. Photocrosslinking generally occurs by the crosslinking of a preformed polymer to form a less soluble crosslinked polymeric network. This can take place either through dimerization of pendant reactive groups attached directly to the polymer chain, or reaction of the polymer with a separate polyfunctional photoactive crosslinking agent. Photopolymerization generally occurs when relatively low molecular weight monomers or oligomers undergo photoinitiated cationic or free radical polymerization to form less soluble polymers.

Photohardenable materials are used as the photohardenable layer in the invention. Photohardenable materials can be photocrosslinkable, photopolymerizable, or combinations of both. Photohardenable materials generally comprise a binder, a photoinitiator or photoinitiator system (hereinafter referred to as "photoinitiator system") and a photohardenable component, which is at least one of (i) a low molecular weight monomer or oligomer capable of undergoing polymerization, (ii) reactive groups pendant to the binder which are capable of reacting with each other or (iii) reactive groups pendant to the binder and a crosslinking agent capable of reacting with the reactive groups.

Materials which can be used as the binder include polymers and copolymers of acrylates, methacrylates, acrylamides, styrene, vinyl acetate and its partially hydrogenated derivatives, including amphoteric interpolymers. Also gelatin and cellulose esters and ethers, and elastomeric materials, such as polymers and copolymers of butadiene and isoprene can be used. The photoinitiator system is one which, upon irradiation with actinic radiation, forms a species which will initiate either free radical or cationic crosslinking or polymerization reactions. By actinic radiation, it is meant high energy radiation including but not limited to UV, visible, electron beam, and X-ray.

Most photoinitiator systems for free radical reactions in current use are based upon one of two mechanisms: photofragmentation and photoinduced hydrogen abstraction. Suitable photoinitiator systems of the first type include peroxides, such as benzoyl peroxide; azo compounds, such as 2,2'-azobis(butyronitrile); benzoin derivatives, such as benzoin and benzoin methyl ether; derivatives of acetophenone, such as 2,2-dimethoxy-2-phenylacetophenone; ketoxime esters of benzoin; triazines; and biimidazoles. Suitable photoinitiator systems of the second type include anthraquinone and a hydrogen donor; benzophenone and tertiary amines; Michler's ketone alone and with benzophenone; thioxanthones; and 3-ketocoumarins.

Photoinitiator systems suitable for cationic crosslinking or polymerization reactions are those which, upon irradiation, produce a Lewis acid or a protonic Bronsted acid which is capable of initiating polymerization of ethylene oxide or epoxy derivatives. Most photoinitiator systems of this type are onium salts, such as diazonium, iodonium and sulfonium salts.

Sensitizing agents can also be included with the photoinitiator systems discussed above. In general, sensitizing agents are those materials which absorb radiation at a wavelength different than that of the reaction-initiating component, and are capable of transferring the absorbed energy to that component. Thus, the wavelength of the activating radiation can be adjusted.

As mentioned above, the binder can have pendant groups which are capable of undergoing free-radical induced or cationic crosslinking reactions. Pendant groups which are capable of undergoing free-radical induced crosslinking reactions are generally those which contain sites of ethylenic unsaturation, such as mono- and polyunsaturated alkyl groups; acrylic and methacrylic acids and esters. In some cases, the pendant crosslinking group can itself be photosensitive, as is the case with pendant cinnamoyl or N-alkyl stilbazolium groups. Pendant groups which are capable of undergoing cationic crosslinking reactions include substituted and unsubstituted epoxide and aziridine groups.

Monomers undergoing free-radical polymerization are typically ethylenically unsaturated compounds. Examples of which include acrylate and methacrylate esters of alcohols and their low molecular weight oligomers. Examples of suitable monomers and oligomers with two or more sites of unsaturation capable of undergoing free radical induced addition reactions, include the polyacrylate and polymethacrylate esters of polyols such as triethyleneglycol, trimethylolpropane, 1,6-hexanediol, and pentaerythritol, and their low molecular weight monomers. Esters of ethoxylated trimethyolol propane, in which each hydroxyl group has been reacted with several molecules of ethylene oxide, as well as monomers derived from bisphenol A diglycidyl ether and monomers derived from urethanes have also been used. Monomers which undergo cationic polymerization include mono- and polyfunctional epoxides and aziridines. In some cases, where there are residual reactive sites in the binder, e.g., residual unsaturation or epoxide groups, the crosslinking agent can also react with the binder.

Although, any of the above described photosensitive materials can be used in the process of the invention, photohardenable materials which are suitable for the preparation of flexographic printing plates and/or photoresists are preferred, and normally used, and are described in greater detail below.

For creating a relief image on a flexographic printing plate or with a photoresist according to this invention, the photohardenable material comprises a binder, at least one photohardenable component (e.g., a monomer) and an initiator system, where the initiator system has a sensitivity to actinic radiation. In most cases, the initiator will be sensitive to visible or ultraviolet radiation. Any photohardenable compositions which are suitable for the formation of flexographic printing plates or imaged resist patterns can be used for the present invention. Examples of suitable compositions for flexographic printing plates have been disclosed, for example, in Chen et al. U.S. Pat. No. 4,323,637, Gruetzmacher et al. U.S. Pat. No. 4,427,759 and Feinberg et al. U.S. Pat. No. 4,894,315.

For creating a relief image on a flexographic printing plate, an elastomeric binder is selected. The elastomeric binder can be a single polymer or mixture of polymers which can be soluble or dispersible in aqueous, semi-aqueous or organic solvent developers. Binders which are soluble or dispersible in aqueous or semi-aqueous developers have been disclosed in Alles U.S. Pat. No. 3,458,311; Pohl U.S. Pat. No. 4,442,302; Pine U.S. Pat. No. 4,361,640; Inoue et al., U.S. Pat. No. 3,794,494; Proskow U.S. Pat. No. 4,177,074; Proskow U.S. Pat. No. 4,431,723; and Worns U.S. Pat. No. 4,517,279, the disclosures of which are hereby incorporated by reference. Binders which are soluble or dispersible in organic solvent developers include natural or synthetic polymers of conjugated diolefin hydrocarbons, including polyisoprene, 1,2-polybutadiene, 1,4-polybutadiene, butadiene/acrylonitrile, butadiene/styrene and isoprene/styrene thermoplasticelastomeric block copolymers and other copolymers. The block copolymers discussed in Chen U.S. Pat. No. 4,323,636; Heinz et al., U.S. Pat. No. 4,430,417; and Toda et al., U.S. Pat. No. 4,045,231, the disclosures of which are hereby incorporated by reference, can be used. It is preferred that the binder be present in at least an amount of 50% by weight of the photohardenable layer.

The term binder, as used herein, encompasses core shell microgels and blends of microgels and preformed macromolecular polymers, such as those disclosed in Fryd et al. U.S. Pat. No. 4,956,252, the disclosure of which is hereby incorporated by reference.

For photoresist applications of this invention, the binder component of the photosensitive and/or photohardenable layer of the photosensitive element is preferably a carboxylic acid containing copolymer, such as those disclosed in U.S. Pat. Nos. 3,458,311 and 4,273,857, and can be prepared by any of the addition polymerization techniques known to those skilled in the art such as described therein. The level of carboxylic acid groups is determined for a given composition by optimizing the amount needed for good development in aqueous alkaline developer. Preferred binders are those comprised of comonomers of structural unit:

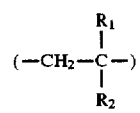

in which $R_1$ is H or alkyl; $R_2$ is phenyl or $CO_2R_3$; and $R_3$ is H or alkyl, which is unsubstituted or substituted. Alkyl groups can contain one to twelve carbon atoms and preferably one to four. Comonomers, which are suitable for forming the binder copolymer, are styrene and unsaturated carboxylic acids and their derivatives, such as (meth)acrylic acid and (meth)acrylates. Acrylic acid, methacrylic acid, methyl methacrylate, styrene, ethyl acrylate, ethyl methacrylate, butyl methacrylate and butyl acrylate are preferred.

The binder copolymers of the invention can be formed by direct copolymerization of one or more ethylenically unsaturated dicarboxylic acid anhydrides, or the corresponding alkyl diesters, with one or more of the above comonomers. Suitable ethylenically unsaturated dicarboxylic acid anhydrides are, for example, maleic anhydride, itaconic acid anhydride and citraconic acid anhydride and alkyl diesters such as the diisobutyl ester of maleic anhydride. The copolymer binder containing acid anhydride functionality can be reacted with primary aliphatic or aromatic amines.

When the photosensitive element is used in a laserable assemblage and subsequently processed to create a resist relief image, development of the composition requires that the binder material should contain sufficient carboxylic acid groups to render the photoresist coating composition processable in aqueous alkaline developer. The coating layer formed from the element will be removed in portions which are not exposed to radiation but will be substantially unaffected in exposed portions during development by aqueous alkaline liquids such as wholly aqueous solutions containing 1% sodium or potassium carbonate by weight for a time period of up to two minutes at a temperature of 30° C. The acid number of the copolymer binder should be within the range of 5 to 500 and preferably from about 20 to 250.

The quantity of total copolymeric binder in the photohardenable layer is from about 10 to 90 parts by weight of the photohardenable layer composition.

One or more cobinders may be present to optimize manufacturability, development or stripping properties, or performance in printed circuit process steps such as electrolytic copper plating or copper etching.

The photohardenable layer can contain a single monomer or mixture of monomers which should be compatible with the binder to the extent that a clear, non-cloudy photosensitive layer is produced. Monomers that can be used in the photohardenable layer are well known in the art. Examples of such monomers can be found in Chen U.S. Pat. No. 4,323,636; Fryd et al., U.S. Pat. No. 4,753,865; Fryd et al., U.S. Pat. No. 4,726,877; and Feinberg et al., U.S. Pat. No. 4,894,315, the disclosures of which are hereby incorporated by reference. It is preferred that the monomer be present in at least an amount of 5% by weight of the photohardenable layer.

The photoinitiator system can be any single compound or group of compounds which is sensitive to actinic radiation, generating free radicals which initiate the polymerization of the monomer or monomers without excessive termination. The photoinitiator is generally sensitive to visible or ultraviolet radiation, preferably ultraviolet radiation. It should be thermally inactive at and below 185° C. Examples of suitable photoinitiators include the substituted and unsubstituted polynuclear quinones. Examples of suitable systems have been disclosed in Gruetzmacher et al., U.S. Pat. No. 4,460, 675 and Feinberg et al., U.S. Pat. No. 4,894,315, the disclosures of which are hereby incorporated by reference. Photoinitiators are generally present in amounts from 0.001% to 10.0% based on the weight of the photohardenable composition.

The photohardenable layer can contain other additives depending on the final properties desired. Such additives include thermal polymerization inhibitors, sensitizers, plasticizers, colorants, antioxidants, antiozonants, fillers or reinforcing agents.

The photohardenable layer can be prepared in many ways by admixing the binder, monomer, initiator, and other ingredients. It is preferred that the photohardenable mixture be formed into a hot melt and then calendered to the desired thickness. An extruder can be used to perform the functions of melting, mixing, deaerating and filtering the composition. The extruded mixture is then calendered between the support and a temporary, removable coversheet. The temporary coversheet is generally previously coated with a barrier layer. The adhesion between the barrier layer and the temporary coversheet must be low, so that the barrier layer will remain intact on the photohardenable layer when the temporary coversheet is removed, which is normally done just prior to use in making a laserable assemblage. Alternatively, the photohardenable material can be placed between the support and the barrier layer coated temporary coversheet in a mold. The layers of material are then pressed flat by the application of heat and/or pressure.

It is particularly advantageous to make the photosensitive element in the form of a continuous printing element. The flat sheet photosensitive element, i.e., the support, photohardenable layer and barrier layer, can be reprocessed by wrapping the element around a cylindrical form, usually a printing sleeve or the printing cylinder itself, and fusing the edges of the photohardenable layer together to form a seamless, continuous element. The donor element on a donor coversheet can then be wrapped around the continuous photosensitive element (receiver element), such that the transfer layer is adjacent to the barrier layer. The transfer layer, as well as other layers of the donor element, can also be made in sleeve form, and slipped over the continuous photosensitive element. The resulting structure is a laserable assemblage. In a preferred method, the photohardenable layer is wrapped around the cylindrical form and the edges joined. One process for joining the edges has been disclosed in German Patent DE 28 44 426. The photohardenable layer can then be spray coated with at least one barrier layer. The donor element is then wrapped around the element such that the transfer layer is adjacent to the barrier layer. The element is then imagewise exposed to laser radiation to fabricate a photomask on the element.

Continuous printing elements have applications in the flexographic printing of continuous designs such as in wallpaper, decoration and gift wrapping paper. Furthermore, such continuous printing elements are well-suited for mounting on conventional laser equipment. The sleeve or cylinder on which the printing element is wrapped when the edges are fused, can be mounted directly into the laser apparatus where it functions as the rotating drum during the laser exposure step.

Unless otherwise indicated, the term "flexographic printing plate or element" encompasses plates or elements in any form suitable for flexographic printing, including, but not limited to, flat sheets and seamless continuous forms.

As discussed above, to prepare a flexographic printing plate, the laserable assemblage, consisting of the donor element and the photosensitive element (receiver element), is first imagewise exposed to infrared laser radiation in the thermal imaging step to effect fabrication of a photomask on the photosensitive element. This results in an actinic radiation opaque mask which adheres to the photohardenable layer (or barrier layer or coversheet) in a pattern. The element is exposed overall to actinic radiation, preferably UV radiation through the mask, and then developed to remove the unexposed areas of the photohardenable layer, i.e., those areas which have not been photohardened. If a barrier layer is present, it is removed in at least the unexposed areas.

Developers which can be used with the photohardenable elements which are used to prepare flexographic printing plates include organic solvent developers, aqueous and semi-aqueous solutions. Suitable organic solvent developers include aromatic or aliphatic hydrocarbon and aliphatic or aromatic halohydrocarbon solvents, or mixtures of such solvents with suitable alcohols. Other organic solvent developers have been disclosed in published German Application 38 28 551. Suitable semi-aqueous developers usually contain water and a water miscible organic solvent and an alkaline material. Suitable aqueous developers contain water and an alkaline material. Other suitable aqueous developer combinations are described in U.S. Pat. No. 3,796,602.

Development time can vary, but it is preferably in the range of about 2 to 25 minutes. Developer can be applied in any convenient manner, including immersion, spraying and brush or roller application. Brushing aids can be used to remove the unpolymerized portions of the composition. For photohardenable systems, washout is frequently carried out in an automatic processing unit which uses developer and mechanical brushing action to remove the unexposed portions of the plate, leaving a relief constituting the exposed image and the floor.

Following development, the relief printing plates are generally blotted or wiped dry, and then dried in a forced air or infrared oven. Drying times and temperatures may vary, however, typically the flexographic plate is dried for 60 to 120 minutes at 60° C. High temperatures are not recommended because the support can shrink and this can cause registration problems.

Additional process steps can be carried out in the preparation of flexographic printing plates from elastomeric photohardenable elements.

One additional step is to give the element a blanket exposure to actinic radiation through the support. This exposure, generally called a backflash exposure, is used to create a shallow layer of photohardened material, or a floor, on the support side of the photohardenable layer and to sensitize the photohardenable layer. The floor provides improved adhesion between the photohardenable layer and the support and also established the depth of the plate relief. This backflash exposure can take place before, after or during the other imaging steps. It is preferred that this step take place immediately prior to the exposure step through the radiation opaque mask. Any conventional sources of actinic radiation can be used for this exposure step. Exposure times for the backflash generally range from a few seconds up to about a minute.

Most flexographic printing plates are uniformly post-exposed to ensure that the photohardenable (e.g., photopolymerization or photocrosslinking) process is complete and that the plate will remain stable during printing and storage. This post-exposure step utilizes the same radiation source as the main exposure.

Detackification is an optional post-development treatment which can be applied if the surface is still tacky, such tackiness not generally being removed in post-exposure. Tackiness can be eliminated by methods well known in the art, such as treatment with bromine or chlorine solutions. Such treatments have been disclosed in, for example, U.S. Pat. Nos. 4,400,459, 4,400,460 and German Patent 28 23 300, the disclosures of which are hereby incorporated by reference. Detackification can also be accomplished by exposure to radiation sources having a wavelength not longer than 300 nm, as disclosed in European Published Patent Application 0 017927 and Gibson U.S. Pat. No. 4,806,506. All references/publications mentioned herein are hereby incorporated by reference unless indicated otherwise.

PROCESS STEPS

1. Exposure

The first step in the process of the invention is imagewise exposing the laserable assemblage to laser radiation. The laserable assemblage comprises the donor element and the receiver element, described above.

The assemblage is prepared following removal of coversheet(s), if present, by placing the donor element in contact with the receiver element such that the transfer layer actually touches the receiver element or the image-receiving layer on the receiver element. In some instances the coversheet is not removed in which case the transfer layer touches the coversheet of the receiver element. Vacuum and/or pressure can be used to hold the two elements together. Alternatively, the donor and receiver elements can be taped together and taped to the imaging apparatus, or a pin/clamping system can be used. As yet another alternative, the donor element can be laminated to the receiver element to afford a laserable assemblage. The laserable assemblage can be conveniently mounted on a drum to facilitate laser imaging.

Various types of lasers can be used to expose the laserable assemblage. The laser is preferably one emitting in the infrared, near-infrared or visible region. Particularly advantageous are diode lasers emitting in the region of 750 to 870 nm which offer a substantial advantage in terms of their small size, low cost, stability, reliability, ruggedness and ease of modulation. Diode lasers emitting in the range of 780 to 850 nm are most preferred. Such lasers are available from, for example, Spectra Diode Laboratories (San Jose, Calif.).

The exposure can take place through the flexible ejection layer of the donor element or through the receiver element, provided that these are substantially transparent to the laser radiation. In most cases, the donor flexible ejection layer will be a film which is transparent to infrared radiation and the exposure is conveniently carried out through the flexible ejection layer. However, if the receiver element is substantially transparent to infrared radiation, the process of the invention can also be carried out by imagewise exposing the receiver element to infrared laser radiation.

The laserable assemblage is exposed imagewise so that material, i.e., the binder and the imageable component, is transferred to the receiver element in a pattern. The pattern itself can be, for example, in the form of dots or line work generated by a computer, in a form obtained by scanning artwork to be copied, in the form of a digitized image taken from original artwork, or a combination of any of these forms which can be electronically combined on a computer prior to laser exposure. The laser beam and the laserable assemblage are in constant motion with respect to each other, such that each minute area of the assemblage, i.e., "pixel" is individually addressed by the laser. This is generally accomplished by mounting the laserable assemblage on a rotatable drum. A flat bed recorder can also be used.

For donor elements of this invention that are used to make a photomask on a photosensitive element for subsequent use in making a relief image, the material transferred from the donor to the receiver and which becomes a mask area must be "substantially opaque to actinic radiation". The term "substantially opaque to actinic radiation" means that the amount of actinic radiation transmitted to the underlying photosensitive layer or photohardenable layer is so miniscule that no significant amount of photoinduced reaction occurs in the photosensitive or photohardenable layer. The material of the donor element may be transferred to the coversheet or the barrier layer or the photohardenable layer of the photosensitive receiver element.

2. Separation

The next step in the process of the invention is separating the donor element from the receiver element. Usually this is done by simply peeling the two elements apart. This generally requires very little peel force, and is accomplished by simply separating the donor support from the receiver element. This can be done using any conventional separation technique and can be manual or automatic without operator intervention.

Throughout the above discussions, the intended product has been the receiver element, after laser exposure, onto which the imageable component has been transferred in a pattern. However, it is also possible for the intended product to be the donor element after laser exposure. If the donor support is transparent, the donor element can be used as a phototool for conventional analog exposure of photosensitive materials, e.g., photoresists, photopolymer printing plates, photosensitive proofing materials, medical hard copies, and the like. For phototool applications, it is important to maximize the density difference between "clear", i.e., laser exposed and "opaque", i.e., unexposed areas of the donor element. Thus the materials used in the donor element must be tailored to fit this application.

3. Additional Processing for Photomask Embodiments

For the embodiments of this invention that involve fabrication of a photomask on a photosensitive element and subsequent use of the photomask to create a relief image, there are additional processing steps, which are discussed below. These additional processing steps will normally include, but are not limited to, imagewise exposure of the photosensitive element to create areas that are photohardened and with other areas still present that remain unphotohardened (areas that remain photohardenable). A subsequent development step to remove unphotohardened material is done under conditions where the areas that are photohardened remain during the course of development, thus creating a relief image on what was the photosensitive element with use of the photomask. Additional details are presented below.

The imagewise exposure is often achieved, but is not limited to, overall exposing the photosensitive element with actinic radiation through the photomask after fabrication of the photomask on the photosensitive element. The type of radiation used is dependent on the type of photoinitiator in the photohardenable layer, and can include, but is not limited to, ultraviolet (UV), visible, and near-infrared radiation. The actinic radiation-opaque material in the photomask on the photohardenable layer prevents the material beneath from being exposed to the actinic laser radiation. For photohardenable systems, those areas covered by the actinic radiation-opaque mask do not polymerize or crosslink. The areas not covered by the actinic radiation-opaque mask are exposed to actinic radiation and photoharden. Most photoinitiators are sensitive to visible or UV radiation. Examples of suitable visible or UV sources include carbon arcs, mercury-vapor arcs, fluorescent lamps, electron flash units electron beam units and photographic flood lamps. The most suitable sources of UV radiation are the mercury-vapor lamps, particularly the sun lamps. A standard radiation source is the Sylvania 350 Blacklight fluorescent lamp (FR 48T12/350 VL/VHO/180, 115 w) which has a central wavelength of emission around 354 nm.

It is contemplated that both the imagewise exposure of a laserable assemblage to actinic radiation during thermal imaging to create a photomask on a photosensitive element and the subsequent overall exposure to actinic radiation (to create areas that are photohardened while other areas remain unphotohardened) can be carried out in the same equipment. It is preferred that this be done using a drum-i.e., the photosensitive element is mounted on a drum which is rotated to allow for exposure of different areas of the element.

For photohardenable systems, it is preferred that this exposure step be carried out in the absence of oxygen. The photohardening reactions will take place when oxygen is present, but they require longer exposure times and the results are less reproducible. The element can be placed in a vacuum frame for the exposure step. If the surface of the photohardenable layer is tacky some type of releasable covering should be put over the layer to prevent it from sticking to the cover in the vacuum frame. Exposure can also be carried out in an inert atmosphere, e.g., nitrogen, or with the surface being swept with an inert atmosphere.

If a barrier layer is present, it will effectively prevent the interaction of oxygen with the photohardenable layer and, thus, the exposure step can be carried out in the presence of atmospheric oxygen.

The actinic radiation exposure time can vary from a few seconds to minutes, depending upon the intensity and spectral energy distribution of the radiation, its distance from the photosensitive element, and the nature and amount of the photosensitive composition (e.g., photohardenable composition). Typically for the photosensitive elements of this invention, a mercury vapor arc or a sunlamp is used at a distance of about 1.5 to about 60 inches (3.8 to 153 cm) from the element. Exposure temperatures are preferably ambient or slightly higher, i.e., about 20° C. to about 35° C.

Following overall exposure to actinic radiation through the photomask formed by the actinic radiation-opaque material, the image is developed to form a relief. The development step is based on the differences in physical properties between the areas of the photohardenable layer which have been exposed to actinic radiation, and those areas which have not been exposed. Development may involve, e.g., washing out the more soluble portions of the photohardenable layer, or transfer of areas of the photohardenable layer to another substrate. When systems are used in which exposure to actinic radiation results in differences in solubility, development is accomplished by washing with a suitable developer solvent. Development is usually carried out at about room temperature. The developers can be organic solvents, aqueous or semi-aqueous solutions. The choice of the developer will depend on the chemical nature of the photosensitive material (e.g., material in the photohardenable layer of the photosensitive element) to be removed.

The following terms are used throughout the specification and/or examples and have the meaning set forth below.

DEFINITIONS

DSC—Differential scanning calorimetry, which is a well-known thermal analysis technique useful for determination of $T_g$ values and other characteristic temperatures.

$T_d$—Thermal decomposition temperature for a given polymer measured in ° C. This value is usually determined using a thermal analysis method such thermal gravimetric analysis or differential scanning calorimetry (DSC).

GTT—Glass transition temperature for a given polymer. The GTT or $T_g$ of a polymer is a type of second order transition. It is defined to be the characteristic temperature for a polymer being heated that represents a phase change from a glassy state (below $T_g$) to a rubbery, flexible state (above $T_g$). Generally, if a polymer has a highly flexible chain, it will have a low $T_g$, whereas, if a polymer is rigid, it will have a high $T_g$. For a given polymer at a temperature below its $T_g$, the polymer will be hard and glassy; for the polymer at a temperature above its $T_g$, it is soft and flexible. The $T_g$ of a given polymer is often determined by DSC. $T_g^o$—This is the glass transition temperature for a given polymer measured by DSC on a sample of the polymer that is either pure polymer containing no plasticizer or is at most only lightly plasticized polymer, such that the measured glass transition temperature is within ±° C. of that for the unplasticized polymer. This temperature is a characteristic temperature for a given polymer. This temperature is in ° C. unless indicated otherwise.

$T_g^1$—This is the glass transition temperature for a given polymer measured by DSC on a sample of the polymer that contains one or more known plasticizers, such that the measured glass transition temperature of the sample is now $T_g^1$ instead of $T_g^o$, wherein $|T_g^o-T_g^1|>3°$ C. This temperature ($T_g^1$) is a characteristic temperature for a given polymer that is plasticized with a given plasticizer (s) to a given extent (degree of plasticization, percentage of plasticizer present, etc.).

Mod.—This is the tensile modulus or simply modulus of the sample measured on an Instron® unit.

Stress—Strain curves are determined by measuring continuously the force developed on a sample when elongated at constant rate of extension. The stress-strain curve serves to define several quantities including modulus, yield stress and elongation at break. Modulus in the slope of the curve.

Sens.—This is the sensitivity, or ablation threshold, of the transfer element, and it corresponds to the minimum laser fluence required for transfer or material removal to occur. The fluence is the laser energy per unit area (e.g. millijoules per $cm^2$).

The following binders are readily utilized in the present invention.

EJECTION LAYER BINDERS

CPVC Chlorinated Poly(vinyl chloride)

PVC poly(vinyl chloride) (Aldrich) $T_{d1}$=282° C., $T_{d2}$=465° C.

PVC 1-#=polyvinyl chloride $T_g$=84° C. (Flexmark Corporation)

PVC2-#=polyvinyl chloride $T_g$=33° C. (Plastic Film Corporation of America)

PVC3-#=polyvinyl chloride $T_g$=64° C. (VCF Films, Inc.)

# is ejection layer thickness in mils as shown in the examples section.

TRANSFER LAYER BINDERS

E2678 Poly(methyl methacrylate) (DuPont) $T_d$=385° C.

EP4043 10% CO, 30% n-butylacrylate and 60% ethylene copolymer $T_d$=457° C. (DuPont)

PMMA Polymethylmethacrylate (DuPont #E2678)

OTHER MATERIALS:

AB 1030 Acrylic Dispersant (DuPont, Wilmington, Del.)

AMAC Ammonium acetate

ABMP 2,2'-azo-bis-2-methylpropionitrile (DuPont Vazo® 64)

DAFB 4-diazo-N,N diethylaniline fluoroborate (Aldrich, Milwaukee, Wis.)

DPP Diphenylphthalate (Aldrich)

Cl-Wax Chlorowax® 50 (Occidental Chemical Corporation)

CyHex Cyclohexanone (Aldrich)

DBP Dibutyl phosphate (Aldrich)

DPP Diphenyl phosphate (Aldrich)

MC Methylene chloride (Aldrich)

MEK Methyl ethyl ketone (Aldrich)

pABA p-azido benzoic acid (Pfaltz and Bauer)

PET Polyethylene terephthalate (DuPont Mylar® 200D)

The following non-limiting examples demonstrate the processes, donor elements and laserable assemblages claimed and described herein. All temperatures throughout the specification are in ° C. (degrees Centigrade) and all percentages are weight percentages unless indicated otherwise.

For the examples described below, the images on paper were obtained using a CREO exposure unit (Creo Inc. Vancouver, Canada). This exposure unit comprises an external drum 30 inch long and 12 inches diameter. Paper was vacuum held on the drum surface and a donor element tightly placed, with the transfer layer towards the paper, directly on top. The drum was pumped through 2 mm holes positioned in rows and columns 1 " apart. In the following examples the center top of the paper is taped to the aluminum drum and the donor element, cut 2" longer and wider than the paper, centered on top. The unused drum was covered with a PET sheet covering the unused pumping orifices. The laserable assemblage, comprising the donor element and the paper (receiver element) was written with an array of 32 infrared diode lasers writing at 830 nm at 1 microsecond pulse width. Beam size was adjusted to 5.8 microns, and the drum speed varied at 25 RPM increments from 100 to 300 RPM to measure sensitivity. The experiment was performed both for 4 layer (control, comparative) donor elements and 3 layer (invention) and 4 layer (invention) donor elements.

The control 4 layer donor element consisted of, in the order listed, a Mylar® (PET) support, a 1 micron polyvinyl chloride (PVC) ejection layer, a thin (metallic) heating layer, and a 1 micron (pigmented) transfer layer of the formulation listed in each specific example. The transfer layer was hand coated onto the sputtered metallic heating layer. In this donor element, the Mylar® support has a tensile modulus of 3.0 GPa and it is assumed that the Mylar® support and the PVC ejection layer have a combined tensile modulus of 3.0 GPa or greater.

The 3 layer donor element within the scope of this invention comprises, in the order listed, a flexible ejection layer(s), a thin (metallic) heating layer, and a 1 micron (pigmented) transfer layer of the formulation listed in each specific example. The ejection layer(s) had a thickness within the range of 1–8 mils which varied as indicated for the individual experiments. The transfer layer was hand coated onto the sputtered metallic heating layer.

The 4-layer donor element within the scope of this invention comprises, in the order listed, a flexible, non-decomposable bottom layer with a tensile modulus of ≦2.5 GPa, a thin ejection layer, a metallic heating layer and a transfer layer.

For each set of examples (listed infra), the sensitivity and image transfer efficiency (or transfer efficiency) of each donor element in the set were determined versus control donor elements by the procedure outlined below. Using the equipment and procedures outlined above, for each donor element being tested, stripes of imaged patterns were obtained using the diode laser array in which drum speeds were varied from 100 to 300 rpm in 25 rpm increments. The optical density (or density) of the image transferred onto paper was measured using a MacBeth densitometer (MacBeth Company, New Burgh, N.Y.) in a reflectance mode for each of the stripes written at the different drum speeds.

In each experiment for each example, the total laser output, measured in an energy unit (e.g., mJ), is constant for a given time interval. Since, in a given experiment, drum speed is varied from 100 rpm up to as high as 300 rpm, this means that the laser fluence (LF) measured in units of energy per unit area (e.g., mJ/cm$^2$) will vary from a relatively high value at 100 rpm to a relatively low value at 300 rpm. There is in fact an approximate inverse relationship of laser fluence (LF) to drum speed (DS). The drum speeds and corresponding laser fluence values are reported in the tables of the examples.

Each set of data for the examples is reported in table format, wherein each table has columns from left to right of 1) drum speed (DS) in revolutions per minute; 2) laser fluence (LF), calculated as explained above, measured in mJ/cm$^2$; and 3) optical density or density values, in which there is one column of density values for each individual example with the density values determined at the indicated drum speeds and laser fluence levels.

In the examples, there is a general trend with regard to density values and drum speeds/laser fluence values. At low drum speeds where the laser fluence, LF, is relatively high, laser fluence is usually not limiting toward adequate thermal imaging, and consequently the densities measured for different experiments are often the same or nearly so. In contrast, at high drum speeds where the laser fluence, LF, is relatively low, laser fluence is often a limiting factor, and the densities measured for different experiments can show appreciable differences. It is the latter type of data at high drum speed, low laser fluence that is most useful in assessing the relative sensitivities and image transfer efficiencies of different transfer elements.

The sensitivity (film sensitivity or donor element sensitivity), or ablation threshold, of a given donor element is defined to be the minimum laser fluence (LF, measured in mJ/cm$^2$) required for transfer of material to occur from the donor element to a given receiver during thermal imaging, with a density (optical density) of at least 0.005 for the transferred material. (At the ablation threshold, the optical density of transferred material is very low (e.g., ~0.005) but still distinguishable over a optical density value of zero.)

The image transfer efficiency for a given experiment with a given donor element and a given receiver element is measured at a specified drum speed and is defined to be the optical density (density) value measured for that donor element and receiver element (i.e., that laserable assemblage) at the specified drum speed. A higher measured density value corresponds in direct proportion to a higher image transfer efficiency. Image transfer efficiency values determined on a comparable basis (same fixed drum speed) are normally used to indicate relative image transfer efficiencies of different laserable assemblage samples (e.g., a given sample versus a control, and/or one given sample versus a second given sample). The higher the magnitude of the measured optical density value for a given donor element and/or laserable sample, the higher is the image transfer efficiency of that donor element and/or laserable assemblage.

EXAMPLES 1-6

These examples illustrate the improved image transfer efficiency and film sensitivity of the 3 layer thermal imaging donor element of this invention in comparison to those for a 4 layer donor element used as a control. In these examples, each formulation was tested as both the 4 layer control structure for the donor element and as the 3 layer structure of this invention for the donor element having the flexible ejection layer.

For the 4 layer control (comparative) donor elements, the PVC ejection layer was coated onto 10" wide 200D Mylar® PET film on a continuous coater operated at a line speed of 100 feet/minute. The die was set up using a 4 mil shim, and the drier temperature was 160° F. in all sections. The ejection layer thickness was 1 micron ($10^{-4}$ cm) which corresponds to coating weights of 100 mg/dm$^2$. In order to avoid the cracking of ejection layer during film handling 10% by weight of diphenyl phthalate was added as plasticizer to the formulation. The $T_g$ of coated samples of this PVC formulation was about 55° C. for the PVC layer alone. The solids in the PVC solution were adjusted to viscosities of 300–400 centipoise. The solvent was methylene chloride (92%) and isopropanol (8%). The solutions were filtered in line using a 10 micron filter prior to coating. A 1 mil polyethylene cover sheet was laminated, during coating, in order to protect the ejection layer from scratching and dust.

After the coating of the ejection layer was completed, it was submitted to Flex, Inc. (Santa Rosa, Calif.) for sputtering of the (metallic) heating layer, which was either Cr sputtered to 45% transmission (~85 Å) or Ni sputtered to 41% transmission (~90 Å). Finally, the top (pigmented) transfer layer was hand coated using a wire rod (#4), which afforded a transfer layer with a thickness ranging from about 0.7 and 1.0 micron.

The 3 layer donor elements of this invention are characterized in having a flexible ejection layer, which is both flexible and decomposable/ejectable at the metal substrate interface to provide improved transfer properties.

Two types of PVC were used for the flexible ejection layer. One was a plasticized material from Plastic Film Corporation of America (Willow Brook, Ill.) with a GTT ($T_g^1$) of about 33° C., and the other was a more lightly plasticized PVC (V240RC from Flexmark (Paoli, Pa.)) with a GTT ($T_g^1$) of about 84° C. The glass transition temperatures were determined by differential scanning calorimetry using a DSC instrument from TA Instruments (Wilmington, Del.). A thermogravometric analysis (TGA) showed that both films have identical decomposition curves with roughly 60% weight loss by 300° C. The main decomposition peak ranges between 282 and 288° C.

The 90 Å Ni heating layer was sputtered onto one of the above PVC flexible ejection layers using a Denton 600 sputtering unit (Cherry Hill, N.J.). The metal thickness was monitored in situ using a quartz crystal and after deposition by measuring reflection and transmission of the films.

In the manufacture of the 3 layer donor element, the (top) transfer layer with the composition listed below was hand coated onto the heating layer using a wire rod (#4), which afforded a transfer layer with a thickness ranging from 0.7 to 1.3 micron.

The optical density (density) listed below in Table 1 for each experiment represents the density of the pigment transferred to paper at the specified drum speed (DS) and the calculated laser fluence (LF). DS and LF are approximately inversely related. Densities were measured using a McBeth reflection densito-meter. Film sensitivities and image transfer efficiencies were then determined as explained supra. Examples 1-6 illustrate that the 3 layer donor elements of this invention have higher (better) sensitivities and image transfer efficiencies than does a comparative 4 layer control donor element, which has an inert, nonflexible support layer of PET, which has a high tensile modulus of 3.0 GPa. Furthermore, these examples illustrate how sensitivities and image transfer efficiencies of the donor elements of this invention varies as a function of thickness of the flexible ejection layer.

Ejection Layer Without Inflexible Support Versus Control (Inflexible Support and PVC)

PVC1-#=polyvinyl chloride $T_g$=84° C. (Flexmark Corporation)

PVC2-#=polyvinyl chloride $T_g$=33° C. (Plastic Film Corporation of America) # is ejection layer thickness in mils Control=200D Mylar® PET coated w/1 micron PVC as described above.

Heating Layer

The heating layer in each of these examples was about 90 Å of nickel sputtered on by Flex, Inc. in the case of the 4 layer control samples and was about 90 Å of nickel sputtered using a Denton 600 unit (Denton, Cherry Hill, N.J.) in case of the 3 layer samples having flexible, decomposable bases according to the invention.

Transfer Layer

A "K dispersion" was made for use in the transfer layer formulation and consisted of the composition given below, which was prepared with the "solvent mix" having the indicated composition below.

K Dispersion

| | |
|---|---|
| Carbon Black Pigment (Cabot Corp. R660 Pellets) | 20 grs |
| 40% AB1030 Dispersant in Toluene | 12.5 grs |
| Solvent Mix | 67.5 grs |
| Pigment/Dispersant/% Solids | 80/20/25 |

Solvent Mix

| | |
|---|---|
| Methyl ethyl ketone | 50 grs |
| 2-Pentanone | 20 grs |
| Butyl Acetate | 15 grs |
| Cyclohexanone | 15 grs |
| Total | 100 grs |

DAFB=4-diazo-N,N diethylaniline fluoroborate (Aldrich)
pABA=p-azido benzoic acid (Pfaltz and Bauer)
ABMP=2,2'-azo-bis-2-methylpropionitrile (DuPont Vazo® 64)
Cl-Wax=Chlorowax® 50 (Occidental Chemical Corporation)
PMMA=Polymethylmethacrylate (DuPont #E2678)
Transfer Layer Composition*

| | |
|---|---|
| EP4043 | 1.05 grs |
| PMMA | 1.05 grs |
| K Dispersion | 12.75 grs |
| dAFB | 0.35 grs |
| pABA | 0.35 grs |
| ABMP | 0.35 grs |
| Cl-Wax | 0.7 grs |
| Methylene Chloride | 33.2 grs |
| Cyclohexanone | 2.42 grs |
| Solids | 13.5% |
| Solids | 7.06 grs |

*Before drying

Ep4043 Polymer (Percentages of Comonomers): 10% CO, 30% MMA, 60% Ethyene); $T_d$=457° C., where $T_d$ is the decomposition temperature. PMMA=poly methyl methacrylate $T_{d1}$=301° C. $T_{d2}$=385° C.

TABLE 1

| DS (rpm) | LF (mJ/cm²) | Optical Density | | | | | |
|---|---|---|---|---|---|---|---|
| | | Ex. 1 Control | Ex. 2 PVC1-6 | Ex. 3 PVC2-2 | Ex. 4 PVC2-4 | Ex. 5 PVC2-6 | Ex. 6 PVC2-8 |
| 100 | 770 | 0.99 | 1.01 | 0.97 | 1.36 | 1.30 | 1.29 |
| 125 | 616 | 1.00 | 0.99 | 1.01 | 1.31 | 1.27 | 1.28 |
| 150 | 513 | 1.04 | 1.07 | 0.88 | 1.28 | 1.27 | 1.27 |
| 175 | 440 | 1.01 | 1.06 | 0.79 | 1.23 | 1.24 | 1.19 |
| 200 | 385 | 1.14 | 1.13 | 0.921 | 1.20 | 1.06 | 1.21 |
| 225 | 342 | 1.07 | 1.09 | 1.01 | 1.13 | 1.02 | 1.22 |
| 250 | 308 | 0.96 | 1.09 | 0.93 | 1.00 | 0.93 | 1.08 |
| 275 | 280 | 0.51 | 0.48 | 0.90 | 1.09 | 1.06 | 1.09 |
| 300 | 257 | 0.02 | 0.32 | 0.90 | 0.93 | 0.99 | 1.12 |

DS = Drum speed in revolutions per minute (rpm)
LF = Laser fluence in mJ/cm²

As indicated by the results in the above table, the 3 layer donor elements of this invention with flexible ejection layers exhibit both improved image transfer effiency and donor element sensitivity relative to a comparable 4 layer control donor element.

The improved image transfer efficiency can be seen by comparing optical density values at a high drum speed, such as 275 or 300 rpm. At 300 rpm, optical density values obtained for the control, PVC1-6 sample, and PVC2-2 sample were 0.02, 0.32, and 0.90, respectively, which indicates significantly higher image transfer efficiency for PVC2-2 or PVC1-6 versus the control. At 275 rpm, optical density values obtained for the control, PVC1-6 sample, and PVC2-2 sample were 0.51, 0.48, and 0.90, respectively, which also indicates higher image transfer efficiency for PVC2-2 versus the control.

The improved sensitivity of donor elements of this invention can be seen by comparing the optical density data at 300 rpm in Table 1. At this high rpm value, the PVC2 and PVC1 samples (within the scope of the invention) all have relatively high optical density values (>0.90 or 0.32), while the control has an optical density value of 0.02. The control, in fact, has an optical density so low that it is below the threshold (0.05), and thus the control is characterized in having a very low sensitivity in comparison to any of the non-control samples.

EXAMPLES 7–18

These examples illustrate the effect of additives in the transfer layer. As in the previous examples, the images on paper were obtained using the CREO laser unit.

The 4 layer donor element control samples consisted of, in the order as listed, a 200D Mylar® PET support, a polyvinyl chloride (PVC) ejection layer coated to 1 micron thickness directly on top of the 200D Mylar® PET support, a heating layer of 90 Å of Ni sputtered onto the PVC layer of the PVC-coated PET, and a (pigmented) transfer layer of the composition specified below. The transfer layer was hand-coated onto the heating layer using a #4 wire rod.

The 3 layer donor element samples consisted of, in the order as listed, a flexible polyvinyl chloride (PVC) ejection layer having the PVC composition/characteristics as listed below, a thin (90 Å) heating layer of sputtered nickel, and a 1 micron (pigmented) transfer layer of the formulation listed in each specific example. The ejection layer had a thickness of 6 mils. The transfer layer was hand coated onto the sputtered metallic heating layer using a #4 wire rod.

The densities of the black pigmented layer transferred onto paper at the different drum speed are listed in Tables 2 and 3.

Ejection Layer Without Inflexible Support Versus Control (Inflexible Support and PVC)

PVC1-#=polyvinyl chloride $T_g=84°$ C. (Flexible Materials, Inc.)

PVC2-#=polyvinyl chloride $T_g=33°$ C. (Plastic Film Corporation of America) # is ejection layer thickness in mils Control=200D Mylar® PET coated with 1 micron of PVC as described above.

Transfer Layer Coating Solution 7–8

| | | | |
|---|---|---|---|
| EP4043 | 2.375 grs | | |
| K Dispersion | 9.5 grs | | |
| DPP | 0.46 grs | | |
| dAFB | 0.25 grs | 5% | |
| Methylene Chloride | 37.20 grs | | |
| % Solids | 12.31% | | |
| Total Solids | 5.46 grs | | |

DPP = Diphenylphthalate

Transfer Layer Coating Solution 9–10

| | | | |
|---|---|---|---|
| EP4043 | 2.375 grs | | |
| K Dispersion | 9.5 grs | | |
| DPP | 0.46 grs | | |
| dAFB | 0.678 grs | 13% | |
| Methylene Chloride | 37.20 grs | | |
| % Solids | 12.31% | | |
| Total Solids | 5.513 grs | | |

Transfer Layer Coating Solution 11–12

| | | | |
|---|---|---|---|
| EP4043 | 2.125 grs | | |
| K Dispersion | 8.5 grs | | |
| DPP | 0.50 grs | | |
| dABA | 0.25 grs | 5% | |
| Methylene Chloride | 33.28 grs | | |
| Cyclohexanone | 5.00 grs | | |
| % Solids | 11.11% | | |
| Total Solids | 5.00 grs | | |

Transfer Layer Coating Solution 13–14

| | | | |
|---|---|---|---|
| EP4043 | 1.7496 grs | | |
| K Dispersion | 7.0 grs | | |
| DPP | 0.50 grs | | |
| dABA | 1.00 grs | 20% | |
| Methylene Chloride | 27.41 grs | | |
| Cyclohexanone | 12.33 grs | | |
| % Solids | 11.11% | | |
| Total Solids | 5.00 grs | | |

Transfer Layer Coating Solution 15–16

| | | |
|---|---|---|
| EP4043 | 2.125 grs | |
| K Dispersion | 8.5 grs | |
| DPP | 0.50 grs | |
| ABMP | 0.25 grs | 5% |
| Methylene Chloride | 33.28 grs | |
| Cyclohexanone | 5.334 grs | |
| % Solids | 11.11% | |
| Total Solids | 5.00 grs | |

Transfer Layer Coating Solution 17–18

| | |
|---|---|
| EP4043 | 1.7496 grs |
| K Dispersion | 7.0 grs |
| DPP | 0.50 grs |
| ABMP | 1.00 grs |
| Methylene Chloride | 27.41 grs |
| Cyclohexanone | 12.33 grs |
| % Solids | 11.11% |
| Total Solids | 5.00 grs |

TABLE 2

| | LF | Optical Density | | | | | |
|---|---|---|---|---|---|---|---|
| DS (rpm) | (mJ/cm²) | Ex. 7 Control | Ex. 8 PVC1 | Ex. 9 Control | Ex. 10 PVC1 | Ex. 11 Control | Ex. 12 PVC1 |
| 100 | 770 | 0.99 | 1.01 | 0.90 | 1.01 | 1.02 | 1.01 |
| 125 | 616 | 1.00 | 0.99 | 0.99 | 1.11 | 1.11 | 1.08 |
| 150 | 513 | 1.04 | 1.07 | 1.00 | 1.08 | 1.13 | 1.01 |
| 175 | 440 | 1.01 | 1.06 | 1.06 | 1.03 | 1.04 | 1.05 |
| 200 | 385 | 1.14 | 1.13 | 1.18 | 1.00 | 0.89 | 0.93 |
| 225 | 342 | 1.07 | 1.09 | 1.19 | 1.03 | 0.48 | 0.88 |
| 250 | 308 | 0.96 | 1.09 | 1.18 | 1.00 | 0.18 | 0.35 |
| 275 | 280 | 0.51 | 0.48 | 1.08 | 1.09 | 0.05 | 0.26 |
| 300 | 257 | 0.02 | 0.32 | 0.5 | 0.93 | — | 0.12 |

DS = Drum speed in revolutions per minute (rpm)
LF = Laser fluence in mJ/cm²

TABLE 3

| | | Optical Density | | | | | |
|---|---|---|---|---|---|---|---|
| DS (rpm) | LF (mJ/cm²) | Ex. 13 Control | Ex. 14 PVC2-4 | Ex. 15 Control | Ex. 16 PVC 1 | Ex. 17 Control | Ex. 18 PVC2-8 |
| 100 | 770 | 0.79 | 0.97 | 0.91 | 1.08 | 0.72 | 1.06 |
| 125 | 616 | 0.81 | 0.99 | 0.97 | 1.00 | 0.76 | 0.82 |
| 150 | 513 | 0.85 | 0.97 | 1.00 | 1.01 | 0.83 | 0.81 |
| 175 | 440 | 0.85 | 1.00 | 1.14 | 1.24 | 0.85 | 0.79 |
| 200 | 385 | 0.78 | 1.05 | 0.76 | 1.25 | 0.71 | 0.72 |
| 225 | 342 | 0.76 | 1.05 | 0.52 | 1.19 | 0.79 | 0.74 |

TABLE 3-continued

| | | Optical Density | | | | | |
|---|---|---|---|---|---|---|---|
| DS (rpm) | LF (mJ/cm$^2$) | Ex. 13 Control | Ex. 14 PVC2-4 | Ex. 15 Control | Ex. 16 PVC 1 | Ex. 17 Control | Ex. 18 PVC2-8 |
| 250 | 308 | 0.65 | 0.93 | 0.19 | 1.32 | 0.47 | 0.60 |
| 275 | 280 | 0.59 | 0.91 | 0.07 | 1.38 | 0.45 | 0.55 |
| 300 | 257 | 0.33 | 0.94 | — | 1.27 | 0.30 | 0.46 |

DS = Drum speed in revolutions per minute (rpm)
LF = Laser fluence in mJ/cm$^2$

As is indicated by the results shown in Tables 2 and 3, the 3 layer donor ts of this invention made with a wide variety of different transfer layer itions afforded improved sensitivities and transfer efficiencies versus able 4 layer donor elements (control samples).

EXAMPLES 19–23

The following examples illustrate the effect of a flexible, non-decomposable bottom layer on the transfer uniformity. The flexible, non-decomposable bottom layers that were tested are polyethylene and polypropylene with tensile moduli of 0.2 and 1.0 GPa, respectively, and the control non-flexible support is Mylar® 200D, with a tensile modulus of 3.0 GPa. All bottom layers were coated with a 1 micron decomposable CPVC ejection layer directly on top. A nickel layer with about 45% transmission was sputtered on the CPVC to absorb the incoming radiation and convert it into heat primarily decomposing the ejection layer. The heating layer was about 85 Å of Ni coated using a Denton 600 unit (Denton, Cherry Hill, N.J.). Finally a 0.9 micron pigmented layer with the formulation listed in Examples 1–7 was coated on the Ni layer as previously described. The sensitivity of the films was measured using the CREO setup described previously. The top layers were coated by hand using rod #4, to thicknesses of 0.8–0.9 micron. The transfer uniformity is illustrated in the following table by measuring the density of the transfer pigment at a number of different positions (as is shown in a strip of density values in one column for a given LF value in the following table). When transfer drop out or modelling defects (explained infra) occur upon thermal imaging, the excursions in the measured density values over the strip of the transferred transfer layer are considerable. In contrast, when the pigmented transfer layer is uniformly transferred in thermal imaging with no significant defects having occurred, the measured density values along the strip are fairly constant. Drop-out defects are small regions in which transfer does not occur either by defective coating or incomplete contact between film and paper due to the presence of a dust particle or dirt. Modelling defects in printing refers to an image in which the transferred solid density changes in a wave-like pattern.

TABLE 4

| | | Density Transferred of Transfer Layer | | | | |
|---|---|---|---|---|---|---|
| DS | LF | S1 Ex. 19 | S2 Ex. 20 | S3 Ex. 21 | S4 Ex. 22 | S5 Ex. 23 |
| 250 | 308 | 0.51 | 0.68 | 0.98 | 0.98 | 0.59 |
| | | 0.73 | 0.67 | 0.97 | 0.99 | 0.59 |
| | | 0.74 | 0.67 | 0.99 | 0.90 | 0.59 |
| | | 0.55 | 0.66 | 0.96 | 0.94 | 0.60 |
| | | 0.79 | 0.67 | 0.96 | 0.98 | 0.60 |

TABLE 4-continued

| | | Density Transferred of Transfer Layer | | | | |
|---|---|---|---|---|---|---|
| DS | LF | S1 Ex. 19 | S2 Ex. 20 | S3 Ex. 21 | S4 Ex. 22 | S5 Ex. 23 |
| | | 0.62 | 0.66 | 0.96 | 0.90 | 0.57 |
| | | 0.76 | 0.68 | 0.98 | 0.90 | 0.61 |
| | | 0.49 | 0.68 | 0.97 | 0.94 | 0.58 |
| | | 0.66 | 0.67 | 1.00 | 0.93 | 0.59 |
| | | 0.78 | 0.65 | 0.99 | 0.92 | 0.56 |
| 300 | 257 | 0.37 | 0.50 | 0.74 | 0.60 | 0.29 |
| | | 0.46 | 0.52 | 0.74 | 0.59 | 0.33 |
| | | 0.26 | 0.49 | 0.76 | 0.64 | 0.31 |
| | | 0.51 | 0.50 | 0.70 | 0.58 | 0.34 |
| | | 0.43 | 0.49 | 0.69 | 0.64 | 0.31 |
| | | 0.24 | 0.48 | 0.78 | 0.60 | 0.31 |
| | | 0.44 | 0.54 | 0.77 | 0.64 | 0.31 |
| | | 0.38 | 0.45 | 0.79 | 0.68 | 0.31 |
| | | 0.41 | 0.52 | 0.69 | 0.60 | 0.29 |
| | | 0.29 | 0.51 | 0.71 | 0.62 | 0.31 |
| 350 | 220 | 0.24 | 0.23 | 0.58 | 0.38 | 0.21 |
| | | 0.06 | 0.21 | 0.52 | 0.35 | 0.21 |
| | | 0.15 | 0.23 | 0.53 | 0.34 | 0.19 |
| | | 0.19 | 0.20 | 0.53 | 0.38 | 0.19 |
| | | 0.23 | 0.24 | 0.59 | 0.34 | 0.22 |
| | | 0.22 | 0.19 | 0.57 | 0.38 | 0.20 |
| | | 0.08 | 0.22 | 0.55 | 0.36 | 0.18 |
| | | 0.14 | 0.21 | 0.58 | 0.41 | 0.21 |
| | | 0.11 | 0.18 | 0.53 | 0.40 | 0.22 |
| | | 0.24 | 0.19 | 0.56 | 0.37 | 0.19 |

DS = Drum speed in revolutions per minute (rpm)
LF = Laser fluence in mJ/cm$^2$

Supports
S1=PET (Mylar® 200D) 2 mils
S2=Polypropylene 1 mil
S3=Polypropylene 2.5 mils
S4=Polypropylene 1.5 mils
S5=Polyethylene 1 mil It is seen from the data in Table 4 that the transfer uniformity for any of the supports S2–S4 (polyethylene or polypropylene, both flexible, non-decomposable supports within the scope of the invention) is much higher (better) than that for the support S1 (a non-flexible, non-decomposable support outside the scope of the invention).

EXAMPLE 24

This example illustrates the effect of varying the level of plasticizer present in PVC upon selected properties of the PVC sample. More specifically, the effects of varying the weight percent of plasticizer present in the composition upon the measured GTT (glass transition temperature, determined by DSC) and the tensile modulus were determined and are reported in Table 5.

In this experiment, samples of unplasticized PVC obtained from Aldrich (Aldrich Chemical Co., Inc., Milwaukee, Wis. 53233) were compounded with varying levels of dibutyl phthalate plasticizer as indicated in Table 5. The resulting solutions in methylene chloride were coated by hand to obtain PVC film samples, which were then characterized for GTT and tensile modulus values as reported in Table 5.

Figure 6:
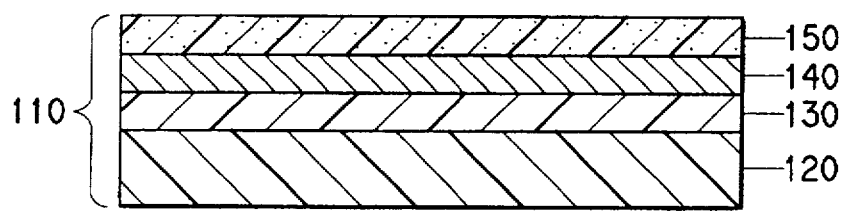
FIG. 6 illustrates a photosensitive receiver element (110) that consists of in sequence a support (120), a photohardenable layer (130), a barrier layer (140) (which is optional), and a coversheet (150) (which is optional).
Figure 7:
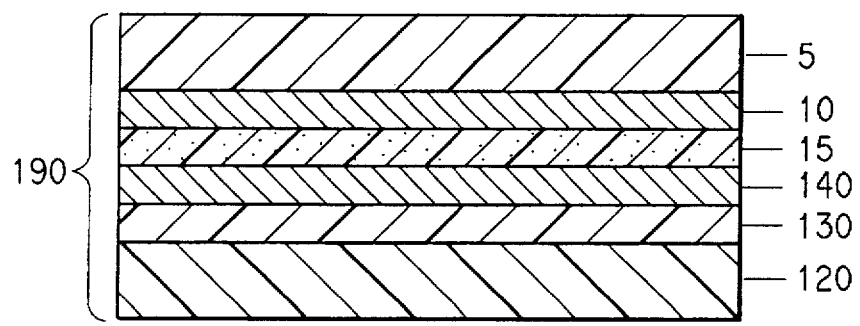
FIG. 7 illustrates a laserable assemblage (190) that is made by bringing donor element (1) in contact with photosensitive receiver element (110) after removal of coversheet (150), wherein transfer layer (15) is in contact with barrier layer (140).
Figure 8:
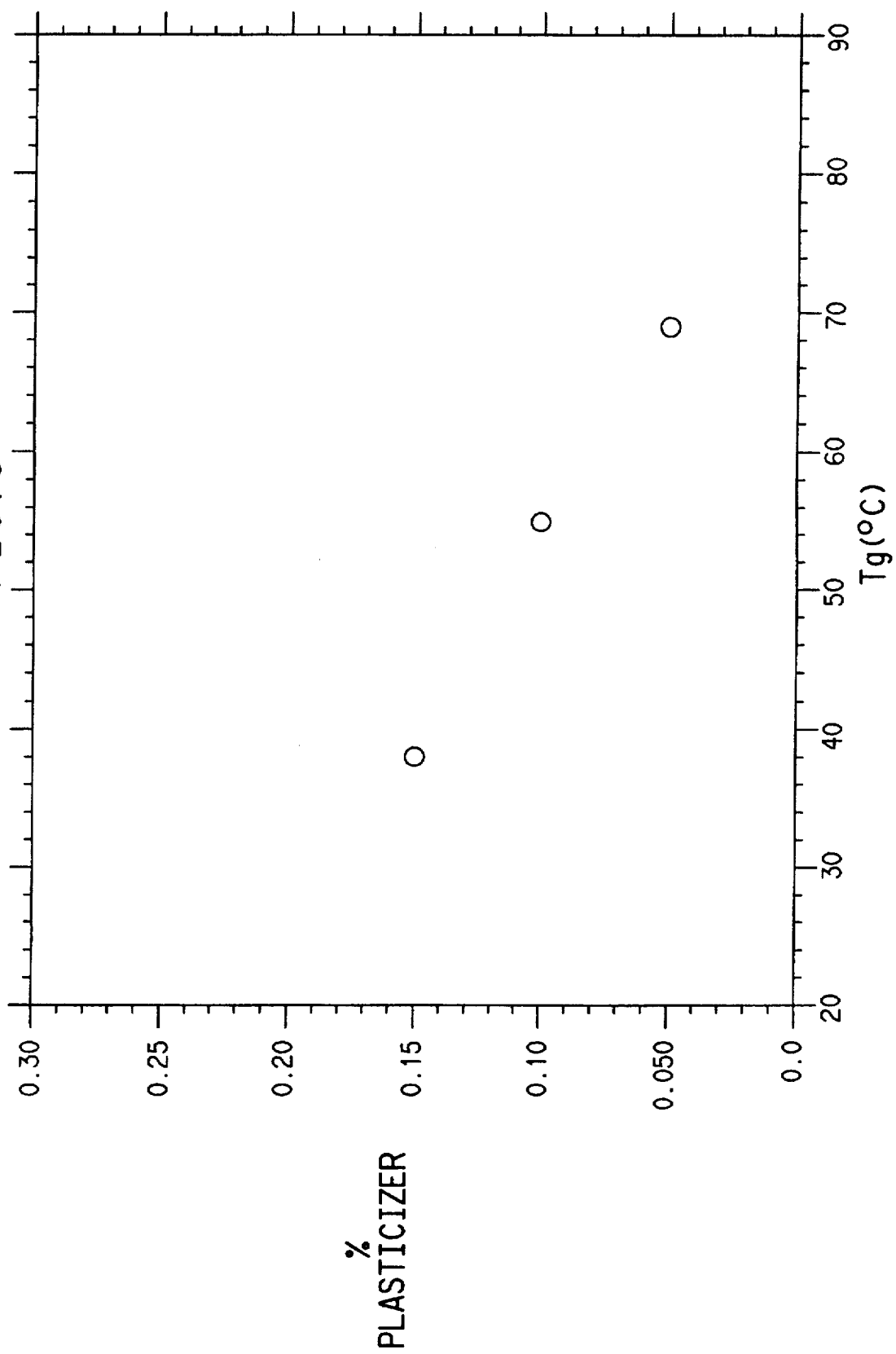
FIG. 8 shows a plot of percentage of plasticizer (di butyl phthalate) in binder (PVC) versus $T_g$ (° C.). As the percentage of plasticizer increases, the $T_g$ decreases.
Figure 9:
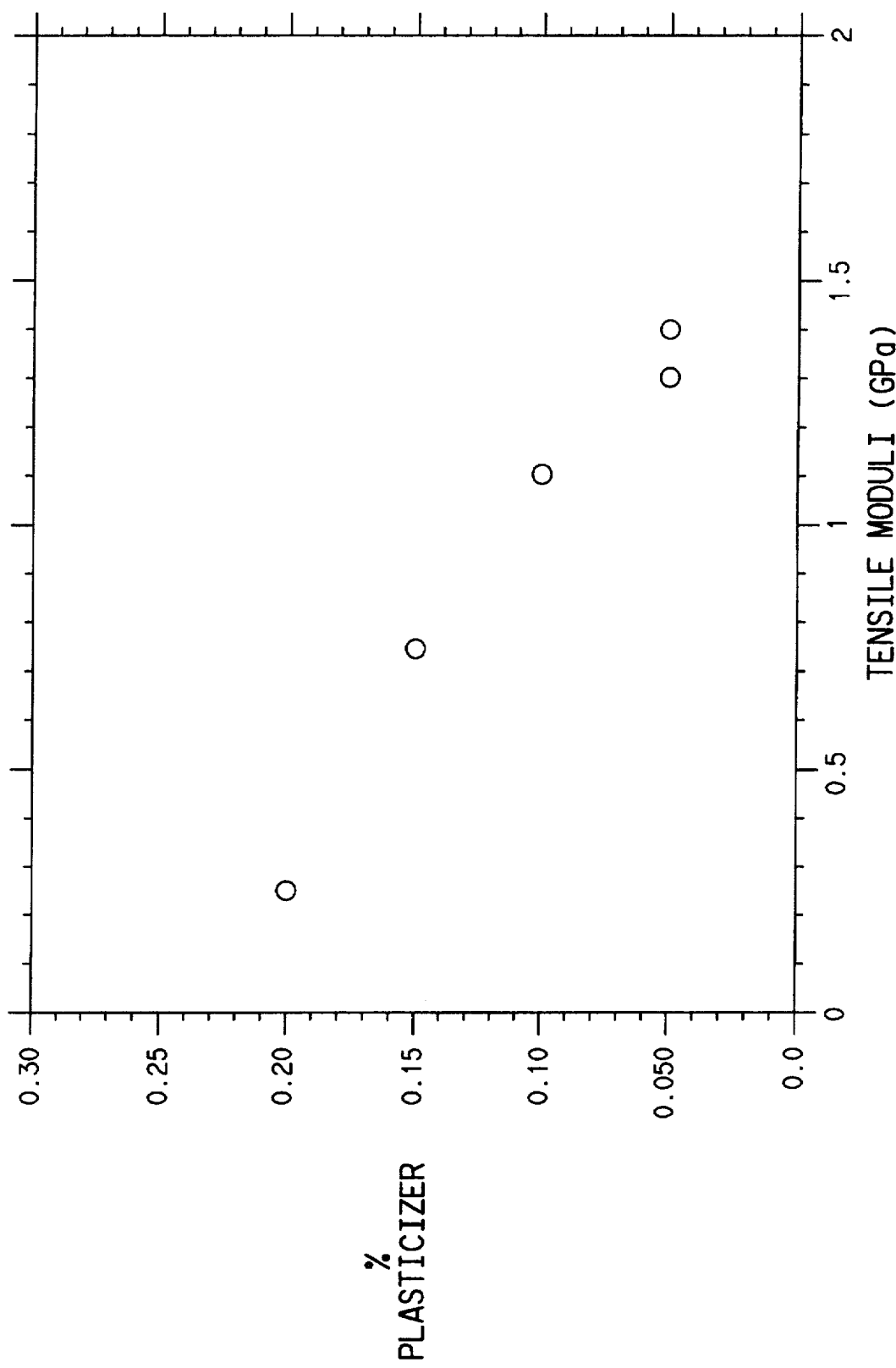
FIG. 9 shows a plot of percentage of plasticizer (di butyl phthalate) in binder (PVC) versus Tensile Moduli (GPa). As the percentage of plasticizer increases, the tensile moduli decreases.
Figure 10:
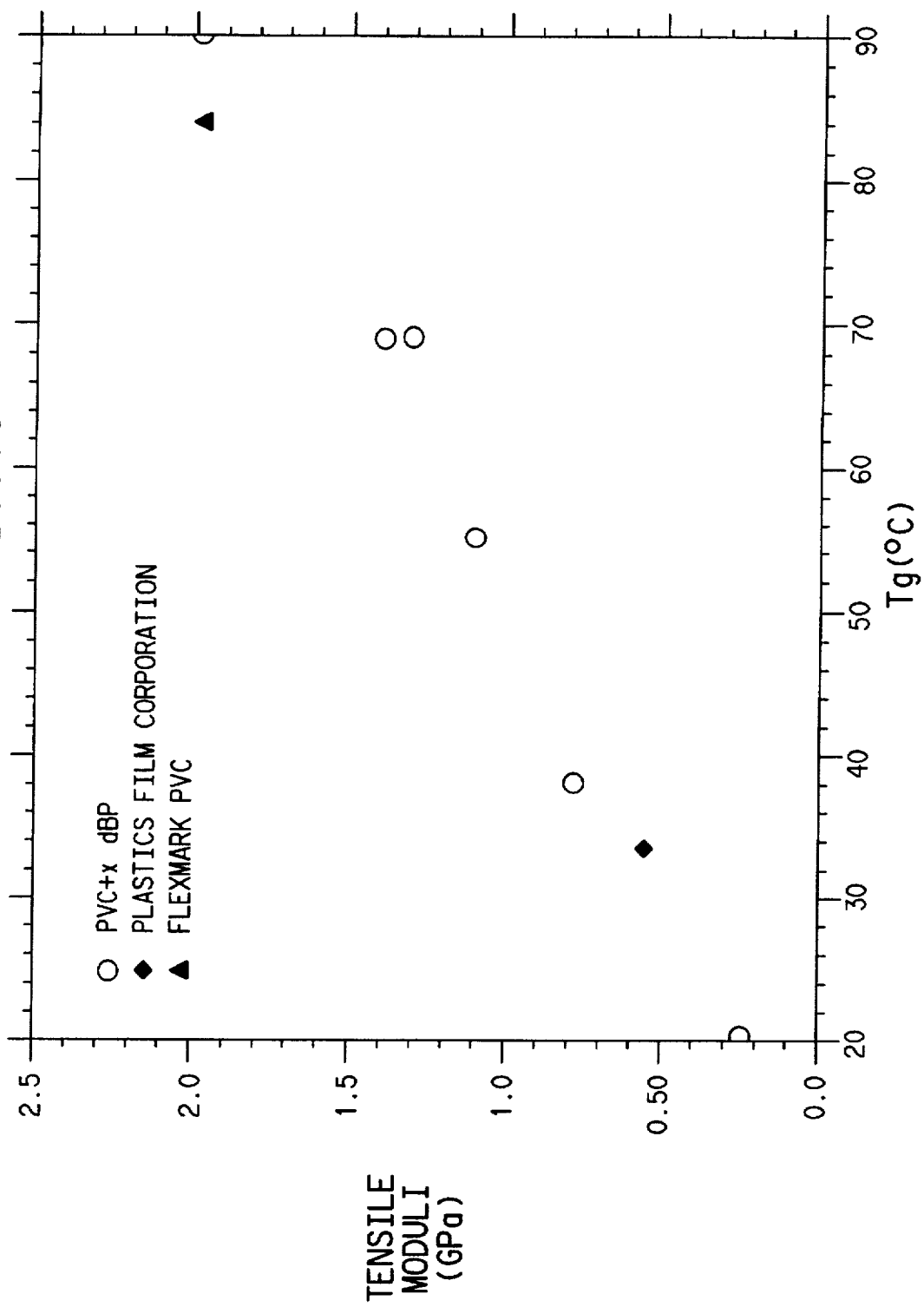
FIG. 10 shows the tensile moduli (GPa) and $T_g$'s of various plasticized PVC samples.

As indicated in Table 5 and in FIGS. 6 and 7, increasing the level of plasticizer in PVC results in substantial decreases in both the measured GTT (glass transition temperature) and the tensile modulus.

TABLE 5

| Wt. % Plasticizer | Modulus (GPa) | GTT (°C.) | $T_g^0 - T_g^1$ |
|---|---|---|---|
| 0 | 1.98 | 89.8 | 0 |
| 0.05 | 1.40 | 68.9 | 21 |
| 0.10 | 1.10 | 54.8 | 35 |
| 0.15 | 0.77 | 38.0 | 51.8 |
| 0.20 | 0.26 | 20.4 | 69.4 |

EXAMPLES 25–29

These examples involve using the laserable assemblages of this invention to create photomasks on photopolymer elements, such as flexographic printing plates and photoresists. The general procedures given below were followed in each of the Examples 25–29. More specifics on each example or set of examples are given below the heading for the example or set of examples.

The photosensitive element (flexographic printing plate, photoresist, or photoresist layer on copper) was the receiver element in these examples. The donor element was a three layer film, which consisted of in sequence a flexible ejection layer, a thin metal heating layer, and a 1 micron black pigmented transfer layer of the formulation listed below in each specific example. The pigmented layer was hand coated onto the sputtered metal layer to afford the 3-layer donor element. The photosensitive element (receiver) was vacuum held on the drum surface and a black-pigmented donor element (3 layer) was tightly stretched, with the black transfer layer towards the receiver, directly on top of the photosensitive element. The drum was pumped through 2 mm holes positioned in rows and columns 1" apart. The center top of the donor element was taped to the aluminum drum and the donor element was cut 3" longer and wider than the receiver, centered on top. The unused drum portion was covered with a Mylar® sheet covering the unused pumping orifices. The resulting laserable assemblage was exposed using an array of 32 infrared diode lasers emitting at 830 nm at 1 microseconds pulse width. Beam size was adjusted to 5.3, 8.0 or 10.0 microns, and the drum speed was varied at 25 RPM increments from 100 to 400 RPM to measure sensitivity. Exposure was such that incident actinic radiation first passed through the flexible ejection layer (e.g. 5) of the donor element, as illustrated in FIG. 7.

EXAMPLE 25

This example illustrates higher transfer efficiencies of 3-layer (inventive) donor elements versus 4-layer (control, comparative) donor elements for transfer to flexographic printing plate receiver elements. Two different 3-layer donor elements were tested—one having a 4 mil PVC flexible ejection layer (PVC3) in Example 26a , and the other having a 2 mil PVC flexible ejection layer (PVC1) in Example 26b. The glass transition temperatures measured for PVC3 and PVC1 are 64° C. and 84° C., respectively. In each case, the measured glass transition temperature was determined using a TA Instruments unit (TA Instruments, Wilmington, Del.). The PVC3 flexible ejection layer in Example 26a was highly elasticized medical grade material.

The 4-layer donor element (control sample) used in this example was the same as that described in Example 1. The control sample consisted of in sequence a 2 mil Mylar® polyethylene terephthalate support (DuPont, Wilmington, Del.), a PVC flexible ejection layer with a 1 micron thickness, a Ni heating layer, and a transfer layer. The metallization of the PVC layer coated onto the support was done at Flex, and Ni was coated to 41% transmission to afford a Ni layer with a thickness of ~90 Å. The pigmented transfer layer was coated using a wire rod #4 onto the Ni heating layer to afford a transfer layer with a thickness ranging from 0.8 to 1.0 micron.

The structure of either inventive donor element (thermal film) in this example consisted of a polyvinyl chloride (PVC) flexible ejection layer, 90 Å of Ni as the heating layer, which was sputtered onto the flexible ejection layer, and a pigmented transfer layer of the composition specified below coated on top of the metallic heating layer. The flexible ejection layer was metallized by Flex, Inc., (Santa Rosa, Calif.) by sputtering Ni to 41% transmission (~90 Å) onto this flexible ejection layer. The metal thickness was monitored in situ using a quartz crystal and after completion of deposition by measuring reflection and transmutation of the metallized PVC film samples. The pigmented transfer layer in each case was hand coated onto the sputtered metal (heating) layer using a wire rod #4, which resulted in a transfer layer with a thickness ranging from about 0.7 to about 1.0 micron.

For each sample in this example, including both of the 3-layer (inventive) donor elements as well as the comparative 4-layer (control) donor element, the transfer layer had the following composition:

Transfer Layer Composition

| | |
|---|---|
| 6% EP4043 in $CCl_2H_2$ | 35.33 g |
| K (80/20/25) dispersion | 12.75 g |
| DAFB | 1.05 g |
| DPP | 0.70 g |
| Cyclohexanone | 2.42 g |
| Solids % | 11% |
| Solids Weight | 6.68 g |

K (80/20/25) Dispersion

| | |
|---|---|
| Carbon black (Cabot Corp. R660 pellets) | 20 g |
| 40% AB1030 in toluene | 12.5 g |
| Solvent Mix (composition same as in Examples 1–6) | 67.5 g |
| Pigment/dispersant/% solids | 80/20/25 |

The receiver for each donor element tested in this example was a Cyrel® 67 HOS flexographic printing plate, which consisted of a support, a mer layer, and a polyamide release layer (the polyamide is Macromelt® Hanbel Corp. Minneapolis, Minn.). The release layer of the flexographic printing plate (receiver) was to contact with the transfer layer of the donor element to afford the assemblage of this example in each case.

Laser imaging of the laserable assemblage as described above was done as indicated in Example 1. Optical densities were determined as summarized in Table 6. The optical densities listed in Table 6 represent the optical density of the pigmented transfer layer that was transferred from the donor element to the release layer of the flexographic printing plate (receiver) at the specified drum speed and corresponding sensitivity upon exposure to laser radiation to effect thermal imaging. The measured optical densities were determined using a MacBeth reflection densitomer.

TABLE 6

| | | Density | | |
|---|---|---|---|---|
| DS | S | Control | Ex. 25a | Ex. 25b |
| 100 | 770 | 1.5 | 1.97 | 1.31 |
| 125 | 616 | 1.2 | 2.11 | 1.36 |
| 150 | 513 | 1.02 | 2.12 | 1.41 |
| 175 | 440 | 0.99 | 2.06 | 1.47 |
| 200 | 385 | 0.91 | 1.91 | 1.55 |
| 225 | 342 | | 1.51 | 1.59 |
| 250 | 308 | | 1.47 | 1.54 |
| 275 | 280 | | 1.31 | 1.57 |
| 300 | 257 | | 1.2 | 1.1 |
| 325 | 244 | | | 0.97 |
| 350 | 226 | | | 0.84 |
| 375 | 211 | | | 0.81 |
| 400 | 198 | | | |

DS = drum speed in revolutions per minute
S = film sensitivity in mJ/cm$^2$

Illustratively, as indicated in Table 6, at a drum speed of 200 rpm where the corresponding sensitivity is 385 mJ/cm$^2$, the densities transferred were 1.91 respectively, for Examples 25a and 25b , versus a density of only 0.91 for the 4-layer donor element (control). This example thus illustrates that higher transfer efficiencies (as reflected by the higher optical densities transferred) for photomask fabrications on a flexographic printing plate are obtained using either of the 3-layer inventive donor elements, which were tested herein as Examples 25a and 25b, relative to the 4-layer donor element (control) having an inflexible polyethylene terephthalate support.

EXAMPLES 26–28

These examples illustrate efficient fabrication of a photomask using a laserable assemblage according to this invention, wherein the photomask is digitally transferred and written onto a layer of commercial Riston® 4615 photopolymer film that is used for photoresist( resist) applications. (Riston® photoresists, E. I. du Pont de Nemours and Company, Wilmington, Del.). The structure of the 3-layer thermal film (donor element) consisted of a 4 mil poly vinyl chloride (PVC3) flexible ejection layer, a heating layer of 90 Å of Ni sputtered onto the flexible ejection layer, and a black pigmented transfer layer with the composition of Example 25 coated on top. The Ni layer was sputtered onto the base by Flex, Inc. (Santa Rosa, Calif.) to 41% transmission (~90 Å). The metal thickness was monitored in situ using a quartz crystal and after deposition by measuring reflection and transmission of the metallic film samples obtained for each stage of sputtering. The top pigmented transfer layer in each case was hand coated using a wire rod #4 which resulted in a film thickness upon drying of approximately 1.0 micron.

These examples illustrate a black mask digitally transferred onto 1) the photopolymer layer of Riston® 4615 after removal of the polyethylene cover sheet, 2) onto the polyethylene cover sheet to expose through it and 3) onto the photopolymer layer of Riston® 4615 which has been laminated to copper (after removal of the coversheet).

In each case, the laserable assemblage was exposed in the CREO using the following arrangement. A(67 mil) Cyrel® 67 HOS flexographic printing plate was placed on the CREO drum, and a given Riston® photoresist sample was then placed directly on top of the Cyrel® sample. A given Riston® photoresist sample and the flexographic printing plate constitute the receiver element in this Example. The flexographic printing plate served as an elastomeric layer increasing the point to point contact between the adjacent surfaces of the Riston® sample and the black pigmented transfer layer of the donor element. The donor and receiver elements together are the laserable assemblage. The 3 layer thermal film donor element described above was placed directly on top of the Riston® photoresist sample with the black transfer layer in direct contact with the Riston® photoresist sample surface. The area of the thermal film (donor element) was larger than that of the underlying layers allowing vacuum to be maintained within the structure. The laser diode head was focused onto the Ni layer with 10.0 microns pitch. The light absorption within the metallic heating layer led to a local temperature rise and partial decomposition of the underlying PVC flexible ejection layer. Gaseous products initially trapped with high kinetic energy were discharged, affording transfer of the black transfer layer from the donor element to the Riston® photoresist sample. The solid optical density of the transfer masks and dot ranges in 150 lines per inch screen that were measured are listed in Table 7. Example 26 refers to a mask transferred onto the photohardenable layer of Riston® 4615, Example 27 refers to a mask transferred onto a Riston®) coversheet (I mil polyethylene), and Example 28 refers to a mask transferred onto a layer of unexposed photopolymer of Riston® 4615 after the Riston® photopolymer layer had been laminated to a copper surface.

TABLE 7

| DS | S | Pitch | OD | Ex 26 d | d | Ex 27 d | d | Ex 28 d | d |
|---|---|---|---|---|---|---|---|---|---|
| 175 | 240 | 10 | 2.8 | 3 | 97 | | | | |
| 175 | 240 | 10 | 2.13 | | | 5 | 97 | | |
| 175 | 240 | 10 | 2.69 | | | | | 5 | 95 |

DS = drum speed in revolution per minute
S = film sensitivity in mJ/cm$^2$
Pitch = area of laser beam at focal plane
d = % dot transferred onto mask
OD = Optical density As indicated above, these examples illustrate that the 3-layer donor elements of this invention afford photomask images on photoresist surfaces having high resolution and high optical densities (i.e., greater than 2).

EXAMPLE 29

This example illustrates the use of a thermal film upon imaging as a digital mask for medical hard copy and phototool applications. Medical hard copy is a hard copy of an x-ray film for medical applications. The thermal film that is employed in these examples has a three layer structure, which in sequence consists of a PVC flexible ejection layer, a chromium heating layer, and a pigmented transfer layer. The PVC flexible ejection layer is either extruded or solvent coated onto a temporary PET support to afford a PVC layer having a thickness in the 1–4 mil range. A 1 mil polyethylene cover sheet is laminated, during coating, merely to protect the ejection layer from scratching and dust. The cover sheet is removed just prior to sputtering of the heating layer. After the coating of the ejection layer is completed, a heating layer of chromium is sputtered onto the PVC layer to a depth of about 85 Å. A top pigmented transfer layer of the formulation in Examples 1–6 is hand coated on top of the chromium layer using a wire rod #4, which results in a transfer layer with a thickness of about 1.0 micron. The temporary PET support is then removed, and the resulting 3-layer structure is the donor element. A laserable assemblage is prepared with polyethylene terephthalate (PET) film as the receiver element with the PET in contact with the transfer layer. The imaging is carried out with a CREO laser unit. After imaging is complete and the donor and receiver elements separated, there is obtained a high quality medical hardcopy or phototool, having areas with high optical density not exposed to laser radiation and having areas with very low optical density that were exposed to laser radiation.

What is claimed is:

1. A donor element for use in a laser-induced thermal transfer process, said element comprising in the order listed:
   (a) at least one flexible ejection layer comprising a first polymer having a decomposition temperature $T_1$;
   (b) at least one heating layer; and
   (c) at least one transfer layer comprising (i) a second polymer having a decomposition temperature $T_2$ and (ii) an imageable component, wherein $T_2 \geq (T_1 + 100°$ C.); with the proviso that the donor element during the transfer process does not include an inflexible support substrate having a tensile modulus of $\geq 2.9$ GPa.

2. The element of claim 1 with the proviso that the donor element during the transfer process does not include a support.

3. The element of claim 1 wherein the at least one flexible ejection layer has a tensile modulus of less than or equal to 2.5 Gigapascals.

4. The element of claim 1 wherein the at least one flexible ejection layer has characteristic glass transition temperatures $T_g^1$ and $T_g^0$, wherein $|T_g^1 - T_g^0|$ is 0°–80° C.

5. The element of claim 1 wherein the at least one flexible ejection layer has a tensile modulus of 0.25 to 1.5 Gigapascals and characteristic glass transition temperatures $T_g^1$ and $T_g^0$, wherein $|T_g^1 - T_g^0|$ is at least 10° C.

6. The element of claim 1 wherein the at least one flexible ejection layer contains plasticizer in the relative percentage by weight of the ejection layer of 0°–40 weight percent.

7. The element of claim 1 wherein the first polymer has a decomposition temperature less than 325° C. and is selected from the group consisting of substituted polystyrenes, polyacrylate esters, polymethacrylate esters, cellulose acetate butyrate, nitrocellulose, poly (vinyl chloride), chlorinated poly(vinyl chloride), polycarbonates, copolymers thereof, and mixtures thereof.

8. The element of claim 1 wherein the heating layer comprises a thin metal layer selected from the group consisting of aluminum, chromium, nickel, zirconium, titanium, and titanium dioxide.

9. The element of claim 1 wherein the second polymer has a decomposition temperature greater than 400° C. and is selected from the group consisting of copolymers of acrylate esters, ethylene, and carbon monoxide and copolymers of methacrylate esters, ethylene and carbon monoxide.

10. The element of claim 1 wherein the first polymer is selected from the group consisting of poly(vinyl chloride), chlorinated poly(vinyl chloride), and nitrocellulose, the heating layer comprises a thin layer of metal selected from the group consisting of nickel and chromium, and the second polymer is selected from the group consisting of copolymers of polystyrene and copolymers of n-butyl-acrylate, ethylene and carbon monoxide.

11. The element of claim 1 wherein
   (a) the flexible ejection layer has a thickness in the range of about 1 mil (25 micrometers) to about 8 mils (200 micrometers),
   (b) the heating layer has a thickness in the range of 20 Å to 0.1 micrometer (µm), and
   (c) the transfer layer has a thickness in the range of about 0.1 micrometer to about 50 micrometers.

12. The element of claim 1 wherein the imageable component is a pigment.

13. The element of claim 1 further comprising a thermal amplification additive in at least one of layers (a) and (c) which is selected from the group consisting of diazo alkyls and diazonium compounds, azido compounds, ammonium salts, oxides which decompose to form oxygen, carbonates, peroxides and mixtures thereof.

14. The element of claim 1 wherein the image transfer efficiency of said element is greater than 0.9 at a laser fluence of about 257 mJ/cm$^2$, and the sensitivity of said element is less than about 257 mJ/cm$^2$.

15. A donor element for use in a laser-induced thermal transfer process, said element comprising in the order listed:
   (a) a flexible bottom layer wherein said layer comprises a polymeric material and wherein the layer has a tensile modulus of $\leq 2.5$ GPa;
   (b) at least one ejection layer comprising a first polymer having a decomposition temperature $T_1$;
   (c) at least one heating layer; and
   (d) at least one transfer layer comprising (i) a second polymer having a decomposition temperature $T_2$ and (ii) an imageable component; and an optional thermal amplification additive is present in at least one of layers (b) and (d) or both; with the proviso that the donor element does not include an inflexible support having a tensile modulus of $\geq 2.9$ GPa and wherein the polymer in layer (a) may be the same or different as the first polymer in layer (b).

16. The element according to claim 15 wherein,
   (a) the flexible bottom layer is chosen from the group consisting of substituted polystyrenes, polyacrylate esters, cellulose acetate butyrate, nitrocellulose, chlorinated polyvinyl chloride, polyvinyl chloride, polycarbonates, polypropylene, polyethylene, copolymers thereof or mixtures or plasticized versions thereof;
   (b) the at least one ejection layer is chosen from the group consisting of substituted polystyrene, polyacrylate esters, polymethacrylate esters, cellulose acetate butyrate, nitrocellulose, chlorinated polyvinyl chloride, polyvinyl chloride, polycarbonates, copolymers thereof or mixtures thereof;
   (c) the at least one heating layer is chosen from the group consisting of aluminum, chromium, nickel, titanium, zirconium, titanium dioxide;
   (d) the second polymer is selected from the group consisting of copolymers of styrene, ethylene and carbon monoxide and copolymers of methacrylate esters, ethylene and carbon monoxide and copolymers of acrylate esters.

17. An element according to claim 16 wherein the ejection layer has a thickness of $\leq 1$ µm.

18. A laser-induced, thermal transfer process which comprises:
   (1) imagewise exposing to laser radiation a laserable assemblage comprising:

(A) a donor element comprising in the order listed:
    (a) at least one flexible ejection layer comprising a first polymer having a decomposition temperature $T_1$;
    (b) at least one heating layer; and
    (c) at least one transfer layer having an outer surface and comprising (i) a second polymer having a decomposition temperature $T_2$ and (ii) an imageable component;

wherein $T_2 \geq (T_1+100°$ C.), with the proviso that the donor element during the transfer process does not include an inflexible support substrate; and (B) a receiver element in contact with the outer surface of the transfer layer (c) of the donor element, wherein a substantial portion of the transfer layer is transferred to the receiver element; and (2) separating the donor element from the receiver element.

19. The process of claim 18 with the proviso that the donor element during the transfer process does not include a support.

20. The process of claim 18 wherein the at least one flexible ejection layer of the donor element has a tensile modulus of less than or equal to 2.5 Gigapascals.

21. The process of claim 18 wherein the at least one flexible ejection layer of the donor element has characteristic glass transition temperatures $T_g^1$ and $T_g^o$, wherein $|T_g^o - T_g^1|$ is at least 10° C.

22. The process of claim 18 wherein the at least one flexible ejection layer of the donor element has characteristic glass transition temperatures $T_g^1$ and $T_g^o$, wherein $|T_g^o - T_g^1|$ is at least 35° C., and has a tensile modulus of less than or equal to 1.5 Gigapascals.

23. The process of claim 18 wherein the first polymer has a decomposition temperature less than 325° C. and is selected from the group consisting of substituted polystyrenes, polyacrylate esters, polymethacrylate esters, cellulose acetate butyrate, nitrocellulose, poly(vinyl chloride), chlorinated poly(vinyl chloride), polycarbonates, copolymers thereof, and mixtures thereof.

24. The process of claim 18 wherein the heating layer comprises a thin metal layer selected from the group consisting of aluminum, chromium, nickel, zirconium, titanium, and titanium dioxide.

25. The process of claim 18 wherein the second polymer has a decomposition temperature greater than 400° C. and is selected from the group consisting of copolymers of styrene, ethylene and carbon monoxide and copolymers of methacrylate esters, ethylene and carbon monoxide and copolymers of acrylate esters.

26. The process of claim 18 wherein the first polymer is selected from the group consisting of polyvinyl chloride, chlorinated poly(vinyl chloride), and nitrocellulose, the heating layer comprises a thin layer of metal selected from the group consisting of nickel and chromium, and the second polymer is selected from the group consisting of copolymers of polystyrene and copolymers of methyl methacrylate, ethylene and carbon monoxide.

27. The process of claim 18 wherein
    (a) the ejection layer has a thickness in the range of about 1 mil (25 micrometers) to about 8 mils (200 micrometers),
    (b) the heating layer has a thickness in the range of 20Å to 0.1 micrometer (μm), and
    (c) the transfer layer has a thickness in the range of about 0.1 micrometer to about 5 micrometers (0.2 mils).

28. The process of claim 18 wherein the imageable component is a pigment.

29. A laser-induced, thermal transfer process which comprises:
    (1) imagewise exposing to laser radiation a laserable assemblage comprising:
        (A) a donor element comprising in the order listed:
            (a) a flexible bottom layer having a tensile modulus of $\leq 2.5$ Gigapascals;
            (b) at least one ejection layer comprising a first polymer having a decomposition temperature $T_1$;
            (c) at least one heating layer; and
            (d) at least one transfer layer having an outer surface and comprising (i) a second polymer having a decomposition temperature $T_2$ and (ii) an imageable component;

wherein $T_2 \geq (T_1+100°$ C.) with the proviso that the donor element does not include an inert inflexible support; and (B) a receiver element in contact with the outer surface of the transfer layer (c) of the donor element, wherein a substantial portion of the transfer layer is transferred to the receiver element; and (2) separating the donor element from the receiver element.

30. An assemblage for use in a laser-induced thermal transfer process, the assemblage comprising:
    (A) a photosensitive receiver element comprising in order:
        (A1) a receiver support;
        (A2) a photohardenable layer comprising a binder, at least one photohardenable component, and an initiator;
        (A3) optionally a barrier layer; and
        (A4) optionally a coversheet;
    (B) a donor element comprising in order;
        (B1) at least one flexible ejection layer comprising a first polymer having a decomposition temperature $T_1$;
        (B2) at least one heating layer;
        (B3) at least one transfer layer having an outer surface and comprising (i) a second polymer having a decomposition temperature $T_2$ and (ii) an imageable component, wherein $T_2$ is greater than or equal to $(T_1+100°$ C.);

wherein the outer surface of the transfer layer (B3) is adjacent to and in contact with a layer of the photosensitive receiver element selected from the group consisting of the photohardenable layer (A2), the optional barrier layer (A3), and the optional coversheet (A4);

wherein a photomask is prepared on the photosensitive receiver element according to the laser-induced thermal transfer process; and with the proviso that the donor element at least during the transfer process does not include an inflexible support substrate having a tensile modulus of greater than or equal to 2.9 GPa.

31. The assemblage of claim 30 with the proviso that the donor element during the transfer process does not include a support.

32. The assemblage of claim 30 wherein the photosensitive receiver element (A) further comprises in order:
    (A5) at least one elastomeric layer;
    (A1) a receiver support;
    (A2) a photohardenable layer comprising a binder, at least one photohardenable component, and an initiator;

(A3) optionally a barrier layer; and (A4) optionally a coversheet.

33. The assemblage of claim 30 wherein the donor element (B) further comprises in order:

(B4) a flexible bottom layer having a tensile modulus of $\leq 2.5$ Gigapascals;

(B1) at least one ejection layer comprising a first polymer having a decomposition temperature $T_1$;

(B2) at least one heating layer; and (B3) at least one transfer layer having an outer surface and comprising (i) a second polymer having a decomposition temperature $T_2$ and (ii) an imageable component; wherein $T_2 \geq (T_1+100)$.

34. The assemblage according to claim 30 wherein the binder of the photohardenable layer of the photosensitive receiver element is elastomeric.

35. The assemblage according to claim 30 wherein the binder of the photohardenable layer of the photosensitive receiver element contains acid or base functionality at a sufficient level, such that the photohardenable layer, following imagewise exposure to actinic radiation, is aqueous developable using aqueous developer solutions that are either basic or acidic.

36. A laser-induced, thermal transfer process which comprises:

(1) imagewise exposing to laser radiation a laserable assemblage comprising:

(A) a photosensitive receiver element comprising in order:

(A1) a receiver support;

(A2) a photohardenable layer comprising a binder, at least one photohardenable component, and an initiator;

(A3) optionally a barrier layer; and (A4) optionally a cover sheet;

(B) a donor element comprising in order:

(B1) at least one flexible ejection layer comprising a first polymer having a decomposition temperature $T_1$;

(B2) at least one heating layer;

(B3) at least one transfer layer having an outer surface and comprising (i) a second polymer having a decomposition temperature $T_2$ and (ii) an imageable component, wherein $T_2$ is greater than or equal to $(T_1+100°$ C.);

wherein the outer surface of the transfer layer (B3) is adjacent to and in contact with a layer of the photosensitive receiver element selected from the group consisting of the photohardenable layer (A2), the optional barrier layer (A3), and the optional coversheet (A4);

the imagewise exposure results in exposed areas of the transfer layer (B3) being transferred to the adjacent layer of the photosensitive receiver element; and with the proviso that the donor element at least during the transfer process does not include an inflexible support substrate having a tensile modulus of greater than or equal to 2.9 GPa; and (2) separating the donor element from the receiver element, thereby forming a photomask on the photosensitive receiver element.

37. The process of claim 36 with the proviso that the donor element during the process does not include a support.

38. The process of claim 36, wherein the donor element (B) comprises in order:

(B4) a flexible bottom layer having a tensile modulus of $\leq 2.5$ Gigapascals;

(B1) at least one ejection layer comprising a first polymer having a decomposition temperature $T_1$;

(B2) at least one heating layer; and (B3) at least one transfer layer having an outer surface and comprising (i) a second polymer having a decomposition temperature $T_2$ and (ii) an imageable component; wherein $T_2 \geq (T_1+100)$.

39. The process according to claim 36 further comprising:

(3) overall exposing the receiver element formed in step (2) to actinic radiation through the photomask; and (4) treating the product of step (3) with at least one developer solution to at least remove the photomask and areas of the photohardenable layer (A2) which were not exposed to actinic radiation.

* * * * *

UNITED STATES PATENT AND TRADEMARK OFFICE
CERTIFICATE OF CORRECTION

PATENT NO. : 5,766,819
DATED : Jun. 16, 1998
INVENTOR(S) : Graciela Beatriz Blanchet-Fincher It is certified that error appears in the above-identified patent and that said Letters Patent is hereby corrected as shown below:

On title page, add item:
 --[63] Related U.S. Application Data
Continuation of Ser. No. 564,546, filed Nov. 29, 1995, now abandoned--

Item [75] should read:
 Inventors:  Graciela Beatriz Blanchet-Fincher
             Greenville, Del.
              Monte Ray Browder
              Chadds Ford, Pa.

Col. 1, line 6, should read:
--This application is a continuation of Ser. No. 08/564,546, filed Nov. 29, 1995, now abandoned--

Signed and Sealed this

Seventeenth Day of August, 1999

Attest:

Q. TODD DICKINSON

*Attesting Officer*    *Acting Commissioner of Patents and Trademarks*